(12) United States Patent
Hiraiwa

(10) Patent No.: US 6,672,109 B1
(45) Date of Patent: Jan. 6, 2004

(54) SILICA GLASS MEMBER, METHOD FOR PRODUCING THE SAME, AND PROJECTION ALIGNERS USING THE SAME

(75) Inventor: Hiroyuki Hiraiwa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/719,998

(22) PCT Filed: Apr. 21, 2000

(86) PCT No.: PCT/JP00/02639

§ 371 (c)(1),
(2), (4) Date: Dec. 19, 2000

(87) PCT Pub. No.: WO00/64826

PCT Pub. Date: Nov. 2, 2000

(30) Foreign Application Priority Data

Apr. 21, 1999 (JP) .......................................... 11-114213

(51) Int. Cl.⁷ .............................................. G01N 23/00
(52) U.S. Cl. .......................... 65/378; 65/413; 65/421; 65/422; 65/424; 65/426; 65/104; 65/117; 65/900; 501/905

(58) Field of Search .......................... 65/413, 422, 421, 65/424, 426, 378, 900, 104, 117; 501/905

(56) References Cited

FOREIGN PATENT DOCUMENTS

JP    A 11-054411    2/1999

*Primary Examiner*—Michael Colaianni
(74) *Attorney, Agent, or Firm*—Oliff & Berridge PLC

(57) ABSTRACT

A silica glass member for use with a light having a specific wavelength of 250 nm or shorter, in which the difference in the maximum and the minimum values of hydroxyl group concentration as measured in a plurality of points within a plane vertical to an optical axis whose center is the crossing point of its optical axis with the optical axis of the silica glass member is 50 ppm or lower; and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm. Thus, a silica glass member having high optical transmittance and a high resistance against ultraviolet radiations is provided.

14 Claims, 16 Drawing Sheets

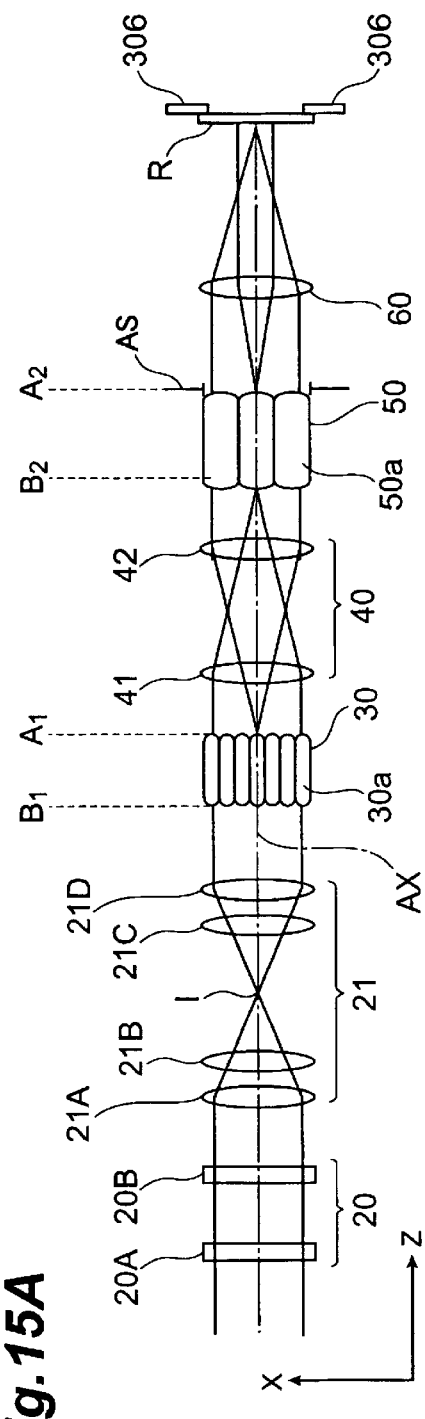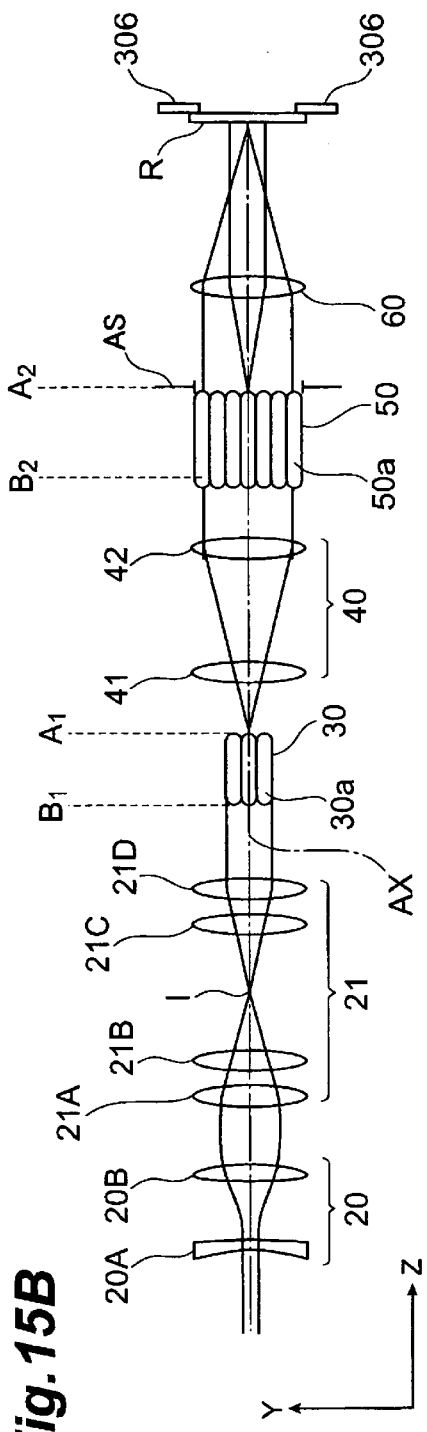

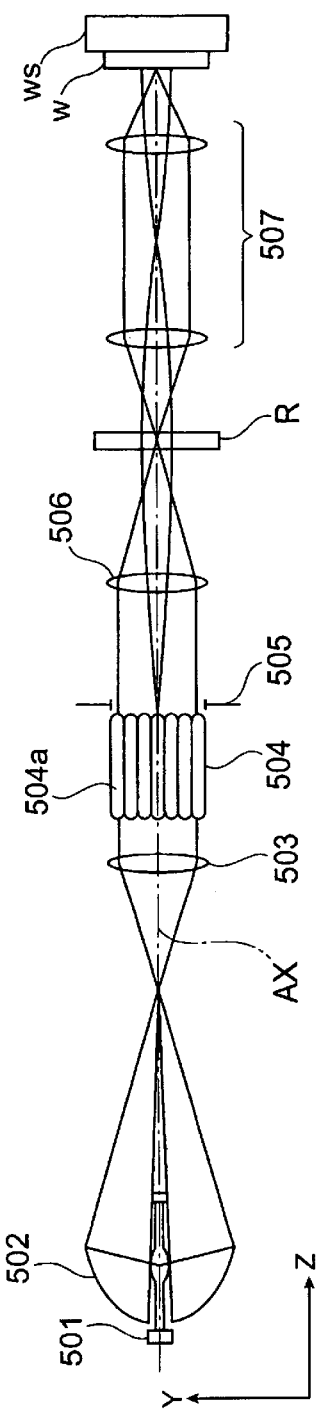
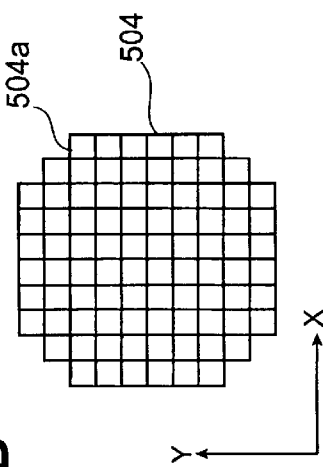
Fig. 16A
Fig. 16B

SILICA GLASS MEMBER, METHOD FOR PRODUCING THE SAME, AND PROJECTION ALIGNERS USING THE SAME

TECHNICAL FIELD

The present invention relates to a silica glass member, a method for using the same, and a projection aligner using the same. In further detail, the present invention relates to a silica glass member for use as a lens of imaging optics for patterning desired mask patterns on substrates by utilizing light sources in the ultraviolet region or vacuum ultraviolet region such as excimer laser radiations, a photomask such as a reticle for transferring circuit patterns of integrated circuits, a diffraction optical element (DOE), an Etalon plate for light sources, or a blank thereof, to a method for producing said silica glass member, and to a projection aligner using the same.

BACKGROUND ART

As a projection aligner for use in producing semiconductor devices, conventionally used are those having the structure shown in FIG. 16A and FIG. 16B.

More specifically, referring to a projection aligner 800 shown in FIG. 16A, a beam emitted from a light source 501 such as a mercury arc lamp, etc., is converged by an elliptical mirror 502, and is converted into parallel beams through a collimator lens 503. The parallel beams then pass through a fly-eye lens 504 consisting of an assembly of optical elements 504a each having a square cross section shown in FIG. 16B to form a plurality of light source images on the light emitting side. An aperture stop 505 having a round opening portion is provided at the position of the light source images. The light beams emitted from the plurality of the light source images are then converged by a condenser lens 506, and a reticle R, which is the object to be irradiated, is uniformly illuminated by the superimposed beams.

The pattern on the reticle R, which is uniformly illuminated by the illuminating optics as above, is projection aligned on a wafer W coated with a resist by a projection optical system 507 consisting of a plurality of lenses. The wafer W is mounted on a wafer stage WS provided movable in two dimension; in case of a projection aligner 800 shown in FIG. 16A, the alignment is performed in the so-called step-and-repeat system (stepper), in which the wafer stage is sequentially moved two-dimensionally for the exposure of the next shot region after the exposure is completed for a one-shot area on the wafer.

Recently, furthermore, there is proposed a scanning type aligner system capable of transferring the pattern of a reticle R onto a wafer W at high throughput, in which a square or an arc beam is irradiated to the reticle R while scanning, in a predetermined direction, the reticle R and the wafer W that are provided in a conjugate arrangement with respect to the projection optics 507.

In order to transfer finer mask pattern images on the wafer plane, i.e., to further increase the resolution, it is further proposed recently to shorten the wavelength of the light source. For instance, radiations with shorter wavelength such as KrF (248 nm) and ArF (193 nm) excimer lasers are being used instead of the conventionally used g-line (436 nm) or i-line (365 nm).

As an optical member for use in the optical system inside the projection aligners above, it is preferred that the member yields a high transmittance for the radiation having the wavelength corresponding to that of the light source being used in the system. This is because, since the optical system of the projection aligner is constructed of a plurality of optical members, even if the optical loss per 1 lens should be small, the total accumulation of the loss for the total number of the optical members leads to a large drop in transmittance. If an optical member having a poor transmittance is used, the exposure light is absorbed by the optical member as to increase the temperature thereof, and this results in a heterogeneous distribution in refractive index inside the optical member; furthermore, the local thermal expansion of the optical member leads to a deformation in the polished plane. Thus, a deterioration in optical performance is induced. In the case of a projection optical system, in particular, it is required that the optical member yields a highly uniform refractive index to obtain fine and clear projection exposure patterns, because a fluctuation in refractive indices leads to a retardation that greatly affects the imaging performance of the projection optical system.

In general, in case of a projection aligner using a light having a longer wavelength than an i-line, a optical glass made from multi-component optical glass is being used for the lens member of the illumination optical system or the projection optical system. However, in case a radiation having a wavelength shorter than the i-line is used for such optical glasses, the internal transmittance for such a radiation abruptly decreases, and in case of radiations having a wavelength not longer than 250 nm, in particular, such optical glasses can no longer exhibit transmittance for the radiations. Thus, as a material for use in an optical member for use in an optical system of a projection aligner equipped with a light source emitting radiations in the ultraviolet region not longer than 400 nm in wavelength, generally employed is a highly uniform silica glass or a single crystal of calcium fluoride that yield high transmittance for radiations in the ultraviolet region. These two materials are required in case of correcting color aberration in the imaging optics of excimer lasers.

Of the optical materials above, a silica glass not only yields a high optical transmittance, but also has superior properties, for instance, it is characterized in that it has an excellent resistance against excimer lasers; that it yields stability to change in temperature; that it has excellent corrosion resistance and elastic properties; and that it has small linear expansion coefficient (about $5.5 \times 10^{-7}$/K) at temperatures in the vicinity or room temperature. Thus, attempts are being made to apply the silica glass as a material constituting the optical members such as reticles, in which some optical properties are required when used in projection aligners, such that it has an excellent UV durability, and that it generates less heat and thereby low thermal expansion occurs.

The application of a single crystal of calcium fluoride to such optical members is being studied, because it has high optical transmittance and an excellent resistance against ultraviolet radiations when used as a material of an optical member, particularly, for radiations having a specified wavelength of 190 nm or shorter.

DISCLOSURE OF INVENTION

However, even in an optical member such as a lens, a photomask substrate, etc., made of silica glass, it was found to yield insufficient optical transmittance or resistance against ultraviolet radiations for light having a specified wavelength of 250 nm or shorter. As described above, this is ascribed to the fact that the optical transmittance of the optical system which consists of a plurality of lenses (a group of lenses) as a whole is the accumulation of each of the optical transmittances of the lenses, and that there are problems such as an increase in transmitting loss of the silica glass attributed to the internal absorption and the internal scattering of the light, a generation of color centers due to laser induction, a decrease in optical performance due to heat generation and phosphorescence, a change in density due to compaction, etc. This tendency becomes particularly distinct in case the optical system is used with a light having a wavelength of 190 nm or shorter.

More specifically, when the optical members were used in a projection aligner using a light source such as an ArF excimer laser (having a wavelength of 193 nm), a $F_2$ laser (having a wavelength of 157.6 nm), etc., there was found to induce a problem of line width deviation and the like in the pattern transfer process, thereby making it extremely difficult to achieve a high resolution.

Furthermore, a single crystal of calcium fluoride was disadvantageous in that it suffered breakage during the process of forming the patterns, because it is brittle and easily subject to flaws due to an inferior stability to a change in temperature. Furthermore, it is also a disadvantage for a single crystal of calcium fluoride that it is difficult to form mask patterns at high precision and that it required a strict control of temperature during the exposure treatment, because the linear expansion coefficient thereof is as high as about 40 times as that of a silica glass.

As described above, with decreasing wavelength of the radiation utilized in the projection aligners, still higher optical performance is being required to the optical members such as lens members, photomask members, etc. however, an optical member having the desired optical performance suitable for use in the optics constituting the device utilizing radiations having a wavelength of 250 nm or shorter, and particularly those having a wavelength of 190 nm or shorter, is yet to be developed. Moreover, even in case of using a material having a high transmittance and a high uniformity in refractive index, the optical system constructed by assembling a plurality of such materials sometimes resulted in a failure of obtaining the desired resolution.

Accordingly, an object of the present invention is to provide a silica glass member having high optical transmittance and resistance against ultraviolet radiation, and a method for producing the same, as well as to provide a projection aligner capable of obtaining high resolution.

In the light of such circumstances, the present inventors extensively conducted studies to achieve the object above, and first investigated the factors affecting the birefringence that occurs within the optical member. Conventionally, the birefringence that occurs within the optical member has been believed to be established by the influence of thermal strain that generates inside the optical member during its cooling process after the thermal treatment. However, the present inventors have found that, particularly in case of a silica glass member, the structural distribution (the distribution of $SiO_2$ bonds) and the impurity distribution greatly affect the generation of birefringence.

Hence, the present inventors have studied the impurities inside the silica glass member in detail, and, as a result, it has been found that, among the structural distribution and the impurities incorporated inside the silica glass member, particularly the distribution in the concentration of hydroxyl groups had the greatest influence on the distribution of birefringence generating inside the silica glass member. Furthermore, the present inventors have studied the cooling process (the process of decreasing temperature) after the thermal treatment, and have found that the cooling rate in the temperature range of from 1500 to 1800° C. was the determining factor in the degree of birefringence generating inside the silica glass in case it was attempted to obtain silica glass members having low birefringence.

In addition to above, the present inventors have found that the birefringence of the material constituting the optical member greatly affects the image forming performance of the projection optical system and the resolution of the projection aligner. Then, it has been also found that an imaging performance near to the designed performance of the projection optical system and the resolution near to the designed performance for the projection aligner can be obtained if the degree of the birefringence of the material constituting the optical member, more specifically, if the birefringence value (in absolute value) is 2 nm/cm or lower and if the distribution of the birefringence within the optical member is symmetrical with respect to the center. This is disclosed in JP-A-Hei8-107060 (wherein, the term "JP-A-" as referred herein signifies "an unexamined published Japanese patent application").

However, with a further requirement for a higher resolution of a projection aligner, there are cases in which a light having a shorter wavelength is used as the light source or a thicker optical member having a larger aperture diameter is employed. In such cases, even though the design philosophy as above should be employed, it was not always possible to obtain favorable imaging performance of the projection optical system and a fair resolution of the projection aligner.

Accordingly, the present inventors further proceeded with the study, and as a result, the reason why it was not possible to obtain the desired projection optical system or projection aligner having the desired optical performance was obtained even in case an optical member having a favorable transmittance or a favorable uniformity in the distribution of refractive index was used. That is, since the state of distribution of the birefringence within the optical member differs from an optical member to another, the optical system obtained by assembling a plurality of optical members as a whole generates a disturbance in the optical wavefront due to the accumulation of different birefringence, and that this greatly affects the imaging performance of the projection optical system or the resolution of the projection aligner.

In other words, in the conventional evaluation of birefringence of an optical member, only the dimension (in absolute value) of the birefringence was discussed, and furthermore, there was no concept of the distribution in birefringence values within the optical member. For instance, in case of measuring the birefringence value of a silica glass member, it was customary in the art to measure the birefringence value on several points located in the vicinity of a distance corresponding to 95% of the diameter of the member, and to adopt the maximum value as the birefringence value of the member. However, in a detailed measurement of the distribution of the birefringence values on a plurality of measuring points within the silica glass member, the present inventors have found that the birefringence values exhibited a non-uniform distribution.

Accordingly, even in case of a silica glass member having a highly uniform refractive index, the influence of birefringence within the member cannot be sufficiently evaluated by a simple control of the maximum value among the several birefringence values measured on several points, and, in particular, it was found extremely difficult to obtain an optical system having the desired performance in case a plurality of members are assembled. Such a non-uniform distribution in birefringence values within the silica glass member is presumably attributed to the temperature distribution at the synthesis, the non-uniform distribution of impurities, or the non-uniform distribution of the structural defects of $SiO_2$ so that the non-uniform distribution in birefringence values is formed within the silica glass member during the cooling of the member.

As described above, since the overall evaluation of birefringence of the optical system constructed from a plurality of optical members cannot be simply represented by the dimension of birefringence of each optical members, the present inventors performed a detailed study on how the non-uniform distribution in birefringence values within the optical members influence the optical system. As a result, in a case of paying particular attention of the non-uniform distribution of the birefringence values in the direction of the fast axis, it has been found for the first time that the birefringence values are accumulated when the optical system is constructed by using the optical members having distribution of the birefringence values having the same fast axis direction, and that this negatively affects the performance of the optical system. It has been also found for the first time that, by assembling optical members having different fast axis directions, the negative influence of the birefringence is cancelled out in the optical system as a whole. Thus, the present inventors accomplished the present invention by also taking into account the knowledge on the influence of the concentration of hydroxyl groups that are present in the silica glass member, which was described hereinbefore on the birefringence generating within the silica glass member.

More specifically, the silica glass member according to the present invention is characterized in that it is a silica glass member for use with a light having a specific wavelength of 250 nm or shorter, in which the difference in the maximum and the minimum values of hydroxyl group concentration as measured in a plurality of points within a plane vertical to an optical axis whose center is the crossing point of its optical axis with the optical axis of the silica glass member is 50 ppm or lower; and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

A silica glass member having such a distribution in difference between the maximum and the minimum values of hydroxyl group concentration within a plane vertical to an optical axis whose center is the crossing point of its optical axis with the optical axis of the silica glass member of 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm yields a high optical transmittance and a high resistance to ultraviolet radiation. Accordingly, in case a lens or a photomask substrate using the silica glass member according to the present invention is applied to constitute the optical system of a projection aligner, the drop in optical transmittance of the entire optical system can be suppressed; furthermore, in case the silica glass member according to the present invention is applied to a photomask substrate, a projection aligner having a high resolution free from line width deviation in a pattern transfer step can be implemented because not only a high optical transmittance can be obtained, but also the generation of birefringence attributed to a local thermal expansion of the member can be suppressed.

Further, the method for producing a silica glass according to the present invention is characterized in that the method comprises: a synthetic step of silica glass bulk comprising, in a synthetic furnace equipped with a burner having a plurality of tubes, ejecting a raw material and a combustion gas from the plurality of tubes of said burner to hydrolyze said raw material in an oxyhydrogen flame, and thereby synthesizing a silica glass bulk having a difference in the maximum and the minimum values of hydroxyl group concentration as measured in a plurality of points within a predetermined internal plane of the bulk of 50 ppm or lower; a step of cooling silica glass bulk, comprising cooling said silica glass bulk under a pressure range of from 0.01 to 0.15 MPa (abs) while controlling the cooling rate in the temperature region of from 1500 to 1800° C. to a range of from 5 to 10° C./min; a step of cutting silica glass bulk, comprising cutting out said silica glass bulk to obtain a silica glass member having the desired shape and size; and a step of heat treating silica glass member, comprising applying a heat treatment to said silica glass member to obtain a silica glass member in which a difference in the maximum and the minimum values of hydroxyl group concentration as measured in a plurality of points within a plane vertical to an optical axis whose center is the crossing point of its optical axis with the optical axis of the silica glass member is 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

The distribution in the concentration of hydroxyl groups within the silica glass member, which greatly influences the distribution in birefringence within the silica glass member, can be controlled by properly adjusting the type of the gases (raw material, oxygen or hydrogen) ejected from each of the tubes of the multi-tubular burner and the ejecting conditions thereof such as the flow rate, etc., while also properly controlling the specific synthetic treatments applied thereto in accordance with the various synthetic methods for silica glass bulk. For instance, in a direct method, the distribution in the concentration of hydroxyl groups can be minimized by controlling the rocking width of the target. In case of soot method, the distribution in the concentration of hydroxyl groups can be minimized by suppressing the maximum hydroxyl group concentration to 50 ppm or lower.

Furthermore, after controlling the distribution in the concentration of hydroxyl groups within the silica glass member during the synthetic step of silica glass bulk as described above, the cooling rate in the temperature range of from 1500 to 1800° C., i.e., in a high temperature region not controlled heretofore, is controlled to a range of from 5 to 10° C./min during the cooling step of silica glass bulk, and the conditions of the heat treatment applied to the silica glass member obtained after the step of cutting the silica glass bulk are properly controlled. In this manner, the distribution of the impurities incorporated into the silica glass member and the structural distribution of $SiO_2$ can be homogenized. As a result, there can be realized a silica glass member having a high optical transmittance and a high resistance against ultraviolet radiation, having a plurality of signed birefringence values obtained based on the birefringence values measured on several points within a plane vertical to an optical axis whose center is the crossing point of its optical axis with the optical axis of the silica glass member (and the direction of the fast axis) falling within a range of from −2.0 to +2.0 nm/cm.

Conventionally, the rate of decreasing the temperature in the cooling step of cooling the silica glass bulk was commonly set at 15° C./min or higher to prevent devitrification from occurring. However, in the method for producing a silica glass member according to the present invention, the cooling rate, particularly in the temperature region of from 1500 to 1800° C., was controlled to a range of from 5 to 10° C./min to avoid devitrification from occurring, while carrying out the cooling under a pressing condition in a pressure region of from 0.01 to 0.15 MPa to prevent the generation of strain within the silica glass member, thereby realizing uniform distribution in the impurities incorporated into the silica glass member and uniform structural distribution of $SiO_2$.

Further, the method for producing a silica glass according to the present invention is characterized in that the method comprises: a synthetic step of silica glass bulk comprising, in a synthetic furnace equipped with a burner having a plurality of tubes, ejecting a raw material and a combustion gas from the plurality of tubes of said burner to hydrolyze said raw material in an oxyhydrogen flame, and thereby synthesizing a silica glass bulk having a difference in the maximum and the minimum values of hydroxyl group concentration as measured in a plurality of points within a predetermined internal plane of the bulk of 50 ppm or lower; a step of cooling silica glass bulk, comprising, while holding said silica glass bulk inside said synthetic furnace, cooling said silica glass bulk based on the temperature difference between the silica glass bulk and the temperature of the external environment; a step of cutting silica glass bulk, comprising cutting out said silica glass bulk to obtain a silica glass member having the desired shape and size; a first heat treatment step of silica glass member, comprising elevating the temperature of said silica glass member to a predetermined temperature in the temperature range of from 1600 to 2300° C. in an inert gas atmosphere in a pressure range of from 0.01 to 0.15 MPa (abs); and a second heat treatment step of silica glass member, comprising, in an inert gas atmosphere maintained in a pressure range of from 0.01 to 0.15 MPa (abs), cooling said silica glass member while controlling the cooling rate in the temperature region of from 1500 to 1800° C. to a range of from 5 to 10° C./min to obtain a silica glass member in which a difference in the maximum and the minimum values of hydroxyl group concentration as measured in a plurality of points within a plane vertical to an optical axis whose center is the crossing point of its optical axis with the optical axis of the silica glass member is 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

The method for producing a silica glass member above comprises producing a silica glass bulk to which the control of distribution in the concentration of internal hydroxyl groups alone is applied, then, applying a heat treatment to a prototype of a member obtained by cutting out the silica glass bulk. Also in this case, the distribution of the impurities incorporated into the silica glass member and the structural distribution of $SiO_2$ can be homogenized by elevating the temperature of the prototype of the member under the conditions above, and then controlling the cooling rate in the temperature region of from 1500 to 1800° C. in a range of from 5 to 10° C./min. As a result, there can be realized a silica glass member having a high optical transmittance and a high resistance against ultraviolet radiation, having a plurality of signed birefringence values obtained (based on the birefringence values measured on several points) within a plane vertical to an optical axis whose center is the crossing point of its optical axis with the optical axis of the silica glass member (and the direction of the fast axis) falling within a range of from −2.0 to +2.0 nm/cm.

In addition, the projection aligner according to the present invention is characterized in that it comprises an exposure light source emitting a light having a wavelength of 250 nm or shorter as the exposure light, a reticle having formed thereon an original pattern image, an irradiation optical system which irradiates a radiation output from said exposure light source to said reticle, a projection optical system which projects a pattern image output from said reticle onto a photosensitive substrate, and an alignment system which aligns said reticle and said photosensitive substrate, in which at least a part of the optical member constituting said irradiation optical system, the optical member constituting said projection optical system, and said reticle, is made of a silica glass member according to the present invention.

The projection aligner according to the present invention realizes an excellent resolution by implementing it with an optical system constructed from a silica glass member according to the present invention.

The concept of "signed birefringence value" as referred in the present invention is explained below.

A signed birefringence value is, a birefringence value having a sign attached thereto by taking into consideration the direction of the fast axis defined in the index ellipsoid used in case of obtaining the birefringence value of an optical member.

More specifically, an effective cross section is taken as the region receiving the circular irradiation of a radiation flux within a plane vertical to an optical axis whose center is the crossing point of its optical axis with the optical axis of the optical member and the direction of the fast axis; the sign is plus (or minus) if the direction of the fast axis in a minute region of the point of measuring the birefringence on the effective cross section is parallel with the direction of radiation from the center corresponding to the crossing point with the optical axis of the optical member, and is minus (or plus) if the direction above is vertical with said direction of radiation.

The above concept of attaching a sign to the birefringence value can be applied to a case a plurality of radiation fluxes are irradiated to a plane vertical to the optical axis having its center at the crossing point with the optical axis of the optical member. In this case again, a plus (or minus) sign is attached to the birefringence value measured if the direction of radiation from the center corresponding to the crossing point with the optical axis of the optical member is parallel with the fast axis direction within a minute region of the point of measuring the birefringence taken on each of the effective cross sections on which a plurality of radiation fluxes are irradiated, or a minus (or plus) sign is attached if the direction above is vertical.

Furthermore, the above concept of attaching a sign to the birefringence value can be applied to a case a radiation flux having a cross section other than a circular shape is irradiated on the plane vertical to the optical axis having its center at the crossing point with the optical axis of the optical member. For instance, it is applicable to a case a radiation flux having a ring cross section or a ellipsoidal cross section is irradiated. Similarly in this case, a plus (or minus) sign is attached to the birefringence value measured if the direction of radiation from the center corresponding to the crossing point with the optical axis of the optical member is parallel with the fast axis direction within a minute region of the point of measuring the birefringence taken on each of the effective cross sections on which a plurality of radiation fluxes are irradiated, or a minus (or plus) sign is attached if the direction above is vertical.

In the explanation below, a plus sign is attached to the measured birefringence value if the direction of radiation from the center corresponding to the crossing point with the optical axis of the optical member is parallel with the fast axis direction within a minute region of the point of measuring the birefringence taken on the effective cross sections on which radiation fluxes are irradiated, and a minus sign is attached if the above directions are vertical to each other.

The signed birefringence value is described more specifically below by making reference to FIG. 1A, FIG. 1B, FIG. 2A, FIG. 2B, FIG. 3A, and FIG. 3B.

FIG. 1A is a schematic diagram showing the direction of the fast axis at the points for measuring birefringence $P_{11}$, $P_{12}$, $P_{13}$, and $P_{14}$, each located at a distance of $r_1$, $r_2$, $r_3$, and $r_4$ from the center O of the effective cross section taken on an optical member L1. In the figure, for the convenience of explanation, the points for measuring birefringence $P_{11}$ to $P_{14}$ are set on a straight line $Q_1$ passing through the center O1 and being extended along the direction of the radius. In the figure, the size of the minute region expressed by the circles at each of the measuring points corresponds to the optical path difference at each of the measuring points. Furthermore, the direction of the linear segments within the minute regions $W_{11}$, $W_{12}$, $W_{13}$, and $W_{14}$ corresponds to the direction of the fast axis. Since the direction of the fast axis at the measuring points $P_{11}$ to $P_{14}$ is in parallel with the direction of the straight line $Q_1$, i.e., the direction of the radius, the birefringence values for the measuring points $P_{11}$ to $P_{14}$ are all expressed with a plus sign attached thereto. On drawing the distribution of the signed birefringence values $A_{11}$, $A_{12}$, $A_{13}$, and $A_{14}$ along the direction of the radius for the measuring points $P_{11}$ to $P_{14}$ obtained in FIG. 1A, for instance, a profile as shown in FIG. 1B can be obtained.

Similar to FIG. 1A, FIG. 2A is a schematic diagram showing the direction of the fast axis at the points for measuring birefringence $P_{21}$, $P_{22}$, $P_{23}$, and $P_{24}$, each located at a distance of $r_1$, $r_2$, $r_3$, and $r_4$ from the center $O_2$ of the effective cross section taken on an optical member L2. Since the direction of the fast axes $W_{21}$, $W_{22}$, $W_{23}$, and $W_{24}$ at the measuring points $P_{21}$ to $P_{24}$ is vertical to the direction of the straight line $Q_2$, i.e., the direction of the radius, the signed birefringence values $A_{21}$, $A_{22}$, $A_{23}$, and $A_{24}$ for the measuring points $P_{11}$ to $P_{14}$ are all expressed with a minus sign attached thereto. On drawing the distribution of the signed birefringence values $A_{21}$ to $A_{24}$ along the direction of the radius for the measuring points $P_{21}$ to $P_{24}$ obtained in FIG. 2A, for instance, a profile as shown in FIG. 2B can be obtained.

Similarly as in FIG. 1A, FIG. 3A is a schematic diagram showing the direction of the fast axis at the points for measuring birefringence $P_{31}$, $P_{32}$, $P_{33}$, and $P_{34}$, each located at a distance of $r_1$, $r_2$, $r_3$, $r_4$ and $r_5$ from the center O of the effective cross section taken on the optical member L2. In the measuring points $P_{11}$ to $P_{14}$, the direction of the fast axes $W_{31}$, $W_{32}$, $W_{33}$, $W_{34}$ and $W_{35}$ at the measuring points $P_{31}$ to $P_{33}$ is in parallel with the direction of the straight line $Q_3$, i.e., the direction of the radius, whereas the direction at points $P_{34}$ and $P_{35}$ is vertical to the direction of the radius. Thus, on drawing the distribution of the signed birefringence values $A_{31}$ to $A_{35}$ along the direction of the radius for the measuring points $P_{31}$ to $P_{35}$ obtained in FIG. 3A, a profile as shown in FIG. 3B can be obtained.

FIG. 4A shows a schematically drawn side view of the m silica glass members constituting the optical system, being arranged sequentially from the light source. FIG. 4B is a schematically drawn cross section view showing the effective cross section vertical to the optical axis of one of the m silica glass members shown in FIG. 4A, i.e., the silica glass member Li arranged at the ith position from the light source.

In the present invention, let the distribution of the birefringence values within the silica glass member be uniform within the direction of thickness of a member in parallel with the direction of optical axis, and let the distribution of the birefringence values in the direction of the radius in the effective cross section perpendicular to the optical axis be non-uniform. The term "effective cross section" as referred herein shows the region receiving the irradiation of light flux within the plane perpendicular to the optical axis of the silica glass member. Thus, the crossing point with the optical axis is taken as the center of the effective cross section, and the radius corresponds to the effective radius of the effective cross section of the silica glass member. Furthermore, since the size of the effective cross section differs depending on the silica glass members in case of measuring the signed birefringence values of the entire optical system, the size of the effective cross section of all of the silica glass members is normalized as such that that the maximum effective radius $r_n$ of the silica glass member should become 1 as shown in FIG. 4A.

Further, in case a plurality of light fluxes are irradiated to the plane vertical to the optical axis having a center corresponding to the crossing point of the optical axis of the silica glass member, the size of the effective cross section of all of the silica glass members is normalized as such that the maximum effective radius $r_n$ corresponding to each of the light fluxes should become 1.

Furthermore, in case a light flux yields a cross section with a shape other than a circular one on the plane vertical to the optical axis having a center corresponding to the crossing point of the optical axis of the silica glass member, for instance, a light flux having a ring cross section or an ellipsoidal cross section is irradiated, the size of the effective cross section of all of the silica glass members is normalized in beforehand as such that each of the silica glass members yield a maximum effective radius $r_n$ corresponding to each of the light fluxes should become 1.

For instance, in case a light flux having a ring cross section is irradiated, the size of the effective cross section of the entire silica glass member is normalized previously in such a manner that the maximum outer diameter of the ring should become 1, and the measurement of the signed birefringence value can be performed in accordance with the method described below in the same manner as the measurement for a light flux having a circular cross section. In case of a light flux having an ellipsoidal cross section is irradiated, the size of the effective cross section of the entire silica glass member is normalized previously in such a manner that the maximum outer diameter for the major axis of the ellipsoid should become 1, and the measurement of the signed birefringence value can be performed in accordance with the method described below in the same manner as the measurement for a light flux having a circular cross section.

To measure the signed characteristic birefringence value of the entire projection system, firstly, with reference to FIG. 4B, a model is set as such that it consists of a plurality of concentrical circles $C_{ij}$ having a center $O_i$ on the effective cross section of one of the optical members, Li, and that said concentrical circles each differing in radius from the center. Then, the birefringence value at a kth measuring point $P_{ijk}$ located on the jth concentrical circle $C_{ij}$ having a radius of $r_j$ from the center $O_i$ is measured. Subsequently, a sign is attached by determining the sign from the relation between the direction of the fast axis at the measuring point $P_{ijk}$ and the direction of the radius to obtain a signed birefringence value $A_{ijk}$.

In this case, i represents the number of the optical member L above constituting the projection optical system (i=1, 2, ... m; 2≤m). Similarly, j represents the number of concentrical virtual circles C present on an effective cross section vertical to the optical axis of said an optical member L, each having a center on said optical axis and different from each other in radius from said optical axis (j=1, 2, ... n; 1≤n). Furthermore, k represents the number of measuring points located on the circumference of said concentrical circles C (k=1, 2, ... h; 1≤h). In this manner, the signed birefringence values $A_{ij1}$ to $A_{ijh}$ are measured for the predetermined measuring points $P_{ij1}$ to $P_{ijh}$ located on the same concentrical circle $C_{ij}$.

Then, the mean signed birefringence value $B_{ij}$, which is the arithmetic mean of the signed birefringence values of the measuring points located on the circumference of the concentrical circle $C_{ij}$ of an optical member Li, is calculated in accordance with the following equation:

$$B_{ij} = \frac{\sum_{k=1}^{h} A_{ijk}}{h} \quad (2)$$

Thus, in case a silica glass member yields a mean signed birefringence value $B_{ij}$ satisfying the relation below, the silica glass member exhibits high optical transmittance and resistance against ultraviolet radiations; furthermore, an optical system utilizing such silica glass members as a whole yields an excellent imaging performance, and the projection aligner equipped with such a projection system exhibits excellent resolution:

$$-2.0 \leq B_{ij} \leq 2.0 \text{ nm/cm} \quad (1).$$

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 15A and FIG. 15B each show schematically drawn constitution of an example of a constitution of an illumination optical system for the projection aligner shown in FIG. 14; and FIG. 16A shows a schematically drawn constitution of an example of a projection aligner of a conventional type, and FIG. 16B is a cross section view of a fly-eye lens used in the projection aligner shown in FIG. 16A.

BEST MODE FOR CARRYING OUT THE INVENTION

Figure 1A:
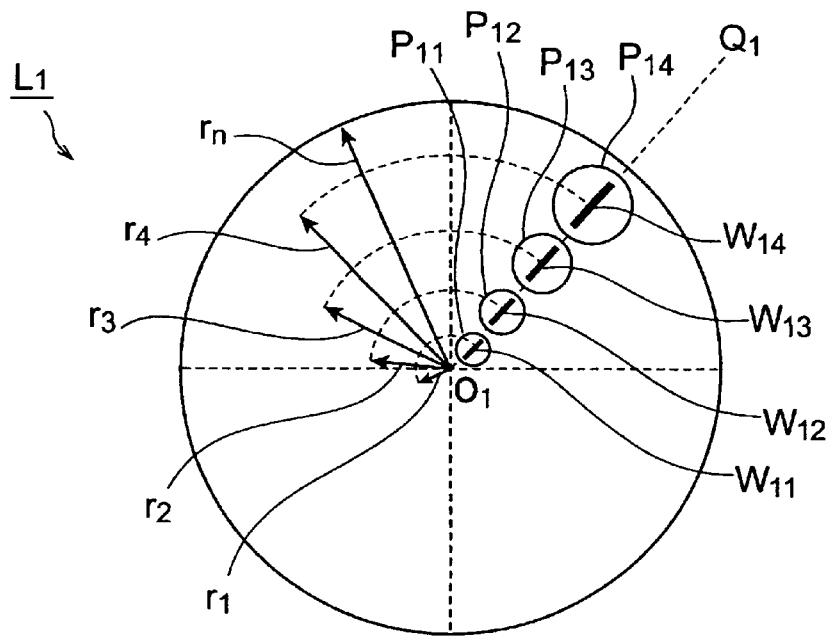
FIG. 1A is a schematic diagram showing the concept of a signed birefringence value.
Figure 1B:
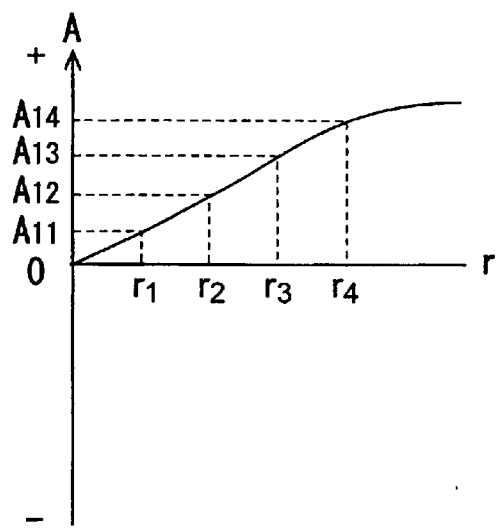
FIG. 1B is a graph showing the distribution of the signed birefringence values within the optical member shown in FIG. 1A.
Figure 2A:
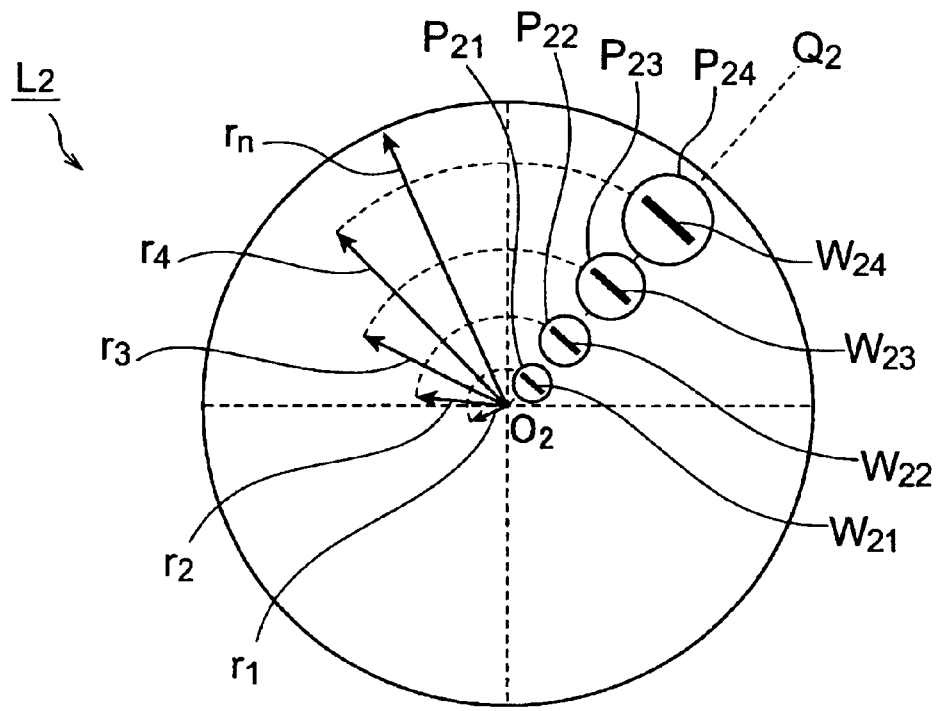
FIG. 2A is another schematic diagram showing the concept of a signed birefringence value.
Figure 2B:
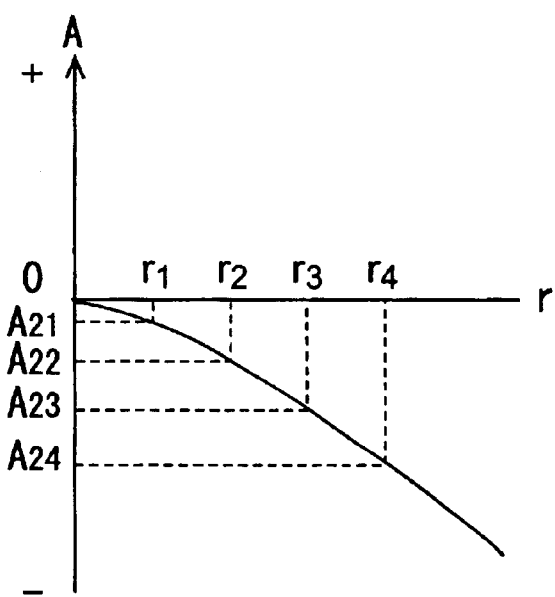
FIG. 2B is a graph showing the distribution of the signed birefringence values within the optical member shown in FIG. 2A.
Figure 3A:
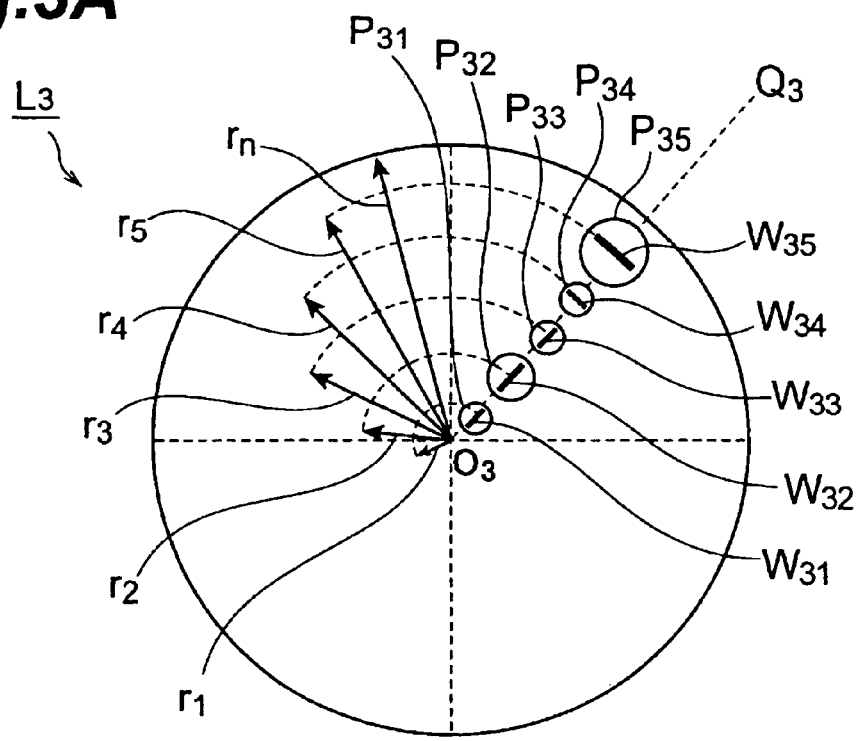
FIG. 3A is a still other schematic diagram showing the concept of a signed birefringence value.
Figure 3B:
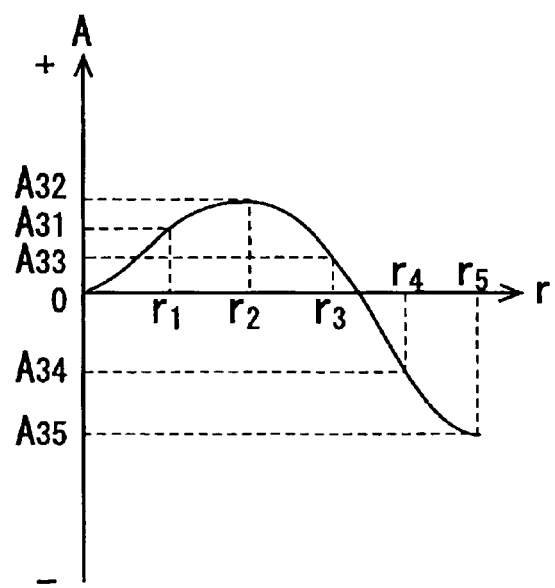
FIG. 3B is a graph showing the distribution of the signed birefringence values within the optical member shown in FIG. 3A.

The present invention is described in further detail below by way of best modes for practicing the present invention with some reference to the drawings. In the figures, the same or corresponding portions are referred by the same symbols.

First, a silica glass member according to the present invention is described.

A silica glass member according to the present invention is a silica glass member made of a synthetic silica glass for use with a light having a specific wavelength of 250 nm or shorter, in which the difference in the maximum and the minimum values of distribution of hydroxyl group a concentration as measured in a plurality of points within a plane vertical to an optical axis whose center is the crossing point of its optical axis with the optical axis of the silica glass member is 50 ppm or lower; and in which, when birefringence values on several points within a plane vertical to an optical axis whose center is the crossing point of its optical axis with the optical axis of the silica glass member are measured, and the plurality of the birefringence values are defined to be positive when the direction of the fast axis is in the radiating direction to the crossing point of the optical axis, whereas they are defined to be negative when the direction of the fast axis is vertical to the crossing point of the optical axis, the plurality of signed birefringence values fall within a range of from −2.0 to +2.0 nm/cm.

The hydroxyl groups that are present in the silica glass member have the function of stabilizing the structure of a silica glass, and when a laser radiation is irradiated, they increase the resistance of the silica glass member against ultraviolet radiations by suppressing the generation of an absorption band in the vicinity of a wavelength of 160 nm, which is attributed to the oxygen-deficient type defect in the silica glass (Vo) (≡Si—Si≡, where, ≡ does not represent a triple bond, but shows that Si is bonded with three oxygen atoms). However, on the other hand, it has been found through the study of the present inventors that the distribution state of hydroxyl groups inside the silica glass member greatly influences the distribution of birefringence inside the silica glass member.

The control of the concentration as well as the distribution state of hydroxyl groups inside the silica glass member, as is described hereinafter, is possible by properly adjusting the type of the gases (raw material, oxygen or hydrogen) ejected from each of the tubes of the multi-tubular burner and the ejecting conditions thereof such as the flow rate, etc., while also properly controlling the specific synthetic treatments applied thereto in accordance with the various synthetic methods for silica glass bulk. For instance, it is possible to control the concentration as well as the distribution state of hydroxyl groups inside the silica glass member by adjusting the relative position of the target or the vessel for depositing the silica glass bulk and the burner, or by synthesizing the silica glass bulk while controlling the revolution of the target or the vessel.

As described above, if the difference in the maximum and the minimum values of hydroxyl group concentration distribution within a plane vertical to an optical axis whose center is the crossing point of its optical axis with the optical axis of the silica glass member is 50 ppm or lower, it tends to become easier to obtain a silica glass member having a high optical transmittance and resistance against ultraviolet radiations, in which a plurality of signed birefringence values obtained (based on the birefringence values measured on several points) within a plane vertical to an optical axis whose center is the crossing point of its optical axis with the optical axis of the silica glass member and (the direction of the fast axis) fall within a range of from −2.0 to +2.0 nm/cm. Furthermore, the drop in optical transmittance of the entire optical system can be suppressed if the optical system is constructed from a plurality of such silica glass members having a high optical transmittance and resistance against ultraviolet radiations as described above. Moreover, when constituting an optical system by using a plurality of silica glass members, if the silica glass members have a difference in the maximum and the minimum values of hydroxyl group concentration distribution within a plane vertical to an optical axis whose center is the crossing point of its optical axis with the optical axis of the silica glass member of 50 ppm or lower, and if they also yield a plurality of signed birefringence values obtained (based on the birefringence values measured on several points) within a plane vertical to an optical axis whose center is the crossing point of its optical axis with the optical axis of the silica glass member (and the direction of the fast axis) within a range of from −2.0 to +2.0 nm/cm, based on distribution of the signed birefringence values of each of the silica glass members, as described hereinafter, the silica glass members can be easily placed in such a manner that the distribution in the birefringence values can be cancelled out.

On the other hand, if the difference in the maximum and the minimum values of hydroxyl group concentration distribution within a plane vertical to an optical axis whose center is the crossing point of its optical axis with the optical axis of the silica glass member should exceed 50 ppm, not only the degree of birefringence inside the silica glass members increases, but also the distribution of the birefringence becomes non-uniform, and it tends to become difficult to homogenize the distribution in birefringence even if the conditions in each of the process steps for the silica glass member, for example, the cooling rate in the cooling step of the silica glass bulk, etc., should be controlled.

Furthermore, in case the silica glass member according to the present invention is used together with a vacuum ultraviolet radiation having a wavelength of 180 nm or shorter, the concentration of the hydroxyl groups within the plane vertical to the optical axis having its center at the crossing point with the optical axis of the silica glass member is preferably in a range of from 10 ppb to 50 ppm. If the concentration of the hydroxyl groups within the plane vertical to the optical axis having its center at the crossing point with the optical axis of the silica glass member should exceed 50 ppm, the initial transmittance of the silica glass member tends to decrease because the hydroxyl groups yield an absorption band in the vicinity of 150 nm. On the other hand, if the concentration of the hydroxyl groups within the plane vertical to the optical axis having its center at the crossing point with the optical axis of the silica glass member should be less than 10 ppb, not only the silica glass member tends to become structurally unstable, but also the difference in the maximum and the minimum values of hydroxyl group concentration distribution within a plane vertical to an optical axis whose center is the crossing point of its optical axis with the optical axis of the silica glass member tends to exceed 50 ppm.

Furthermore, in case the silica glass member according to the present invention is used together with an ultraviolet radiation having a wavelength of from 180 nm to 250 nm, the concentration of the hydroxyl groups within the plane vertical to the optical axis having its center at the crossing point with the optical axis of the silica glass member is preferably in a range of from 10 ppb to 1000 ppm. If the concentration of the hydroxyl groups within the plane vertical to the optical axis having its center at the crossing point with the optical axis of the silica glass member should be less than 10 ppb, the optical transmittance of the silica glass member tends to decrease for a laser beam of an ultraviolet laser having a wavelength of from 180 nm to 250 nm. If, on the other hand, the concentration of the hydroxyl groups within the plane vertical to the optical axis having its center at the crossing point with the optical axis of the silica glass member should exceed 1000 ppm, it becomes difficult to control the distribution in the concentration of hydroxyl groups.

Furthermore, the present inventors have found that, by constituting an optical system using the optical members above in case a plurality of mean signed birefringence values $B_{ij}$ obtained in a plane vertical to the optical axis having its center at the crossing point with the internal optical axis of the silica glass member according to the present invention satisfy the following formulae, an optical system capable of yielding excellent imaging performance can be implemented. As such optical systems, there can be mentioned an irradiation optical system and a projection optical system of a projection aligner, and, by using them in a reticle and the like, a reticle with long life can be achieved:

$$-2.0 \leq B_{ij} \leq +2.0 \text{ nm/cm} \quad (1)$$

$$B_{ij} = \frac{\sum_{k=1}^{b} A_{ijk}}{h} \quad (2)$$

[where, in formulae (1) and (2) above, i represents the number of said optical members L (i=1, 2, . . . m; 2≦m), j represents the number of concentrical virtual circles C present on an effective cross section vertical to the optical axis of said optical member L, each having a center on said optical axis and different from each other in radius from said optical axis (j=1, 2, . . . n; 1≦n), k represents the number of measuring points located on the circumference of said concentrical circles C (k=1, 2, . . . h; 1≦h), $A_{ijk}$ represents the signed birefringence value at the kth measuring point $P_{ijk}$ located on the circumference of a concentrical circle $C_{ij}$ of an optical member Li, and $B_{ij}$ represents the mean signed birefringence corresponding to the arithmetic mean of the signed birefringence values of the measuring points located on the circumference of a concentrical circle $C_{ij}$ of an optical member Li.]

If the mean signed birefringence values $B_{ij}$ obtained in a plane vertical to the optical axis having its center at the crossing point with the internal optical axis of the silica glass member should fall outside the range specified above, that is, if the mean signed birefringence values $B_{ij}$ should be lower than −2.0 nm/cm, and/or the mean signed birefringence values $B_{ij}$ should be higher than +2.0 nm/cm, it signifies that there is a large scattering, not only in the mean signed birefringence values $B_{ij}$ of the optical members, but also in the signed birefringence values $A_{ijk}$ within the silica glass member. In case a light is irradiated to an optical system constructed from such silica glass members, a disturbance in the wave plane of the light flux generates as to greatly decrease the imaging performance of the optical system, because there is a large difference in the signed birefringence values $A_{ijk}$ depending on the position through which the light passes.

Furthermore, in the projection optical system according to the present invention, the signed birefringence value in the vicinity of the center $O_i$ of the optical member Li is preferably 0.2 nm/cm or lower. Since most of the light irradiated to the optical member has the optical axis in the central portion of the optical member, as compared with the case using an optical member having a birefringence at the central portion, the influence of the birefringence can be greatly reduced by using the optical member satisfying the conditions above.

Moreover, in case of constituting an optical system by using a plurality of the silica glass members as a set, a silica glass member Li according to the present invention preferably yields a distribution in the mean birefringence values $B_{ij}$ as such that it does not have an extreme in the direction of the radius at a point other than the center $O_i$. If the silica glass member is such having a distribution in signed birefringence values with no extremes at points other than the center, it becomes easier to figure out the signed characteristic birefringence value of the entire optical system, and it enables the desired optical performance by effectively canceling out the influences of the birefringence of each of the members.

Figure 5:
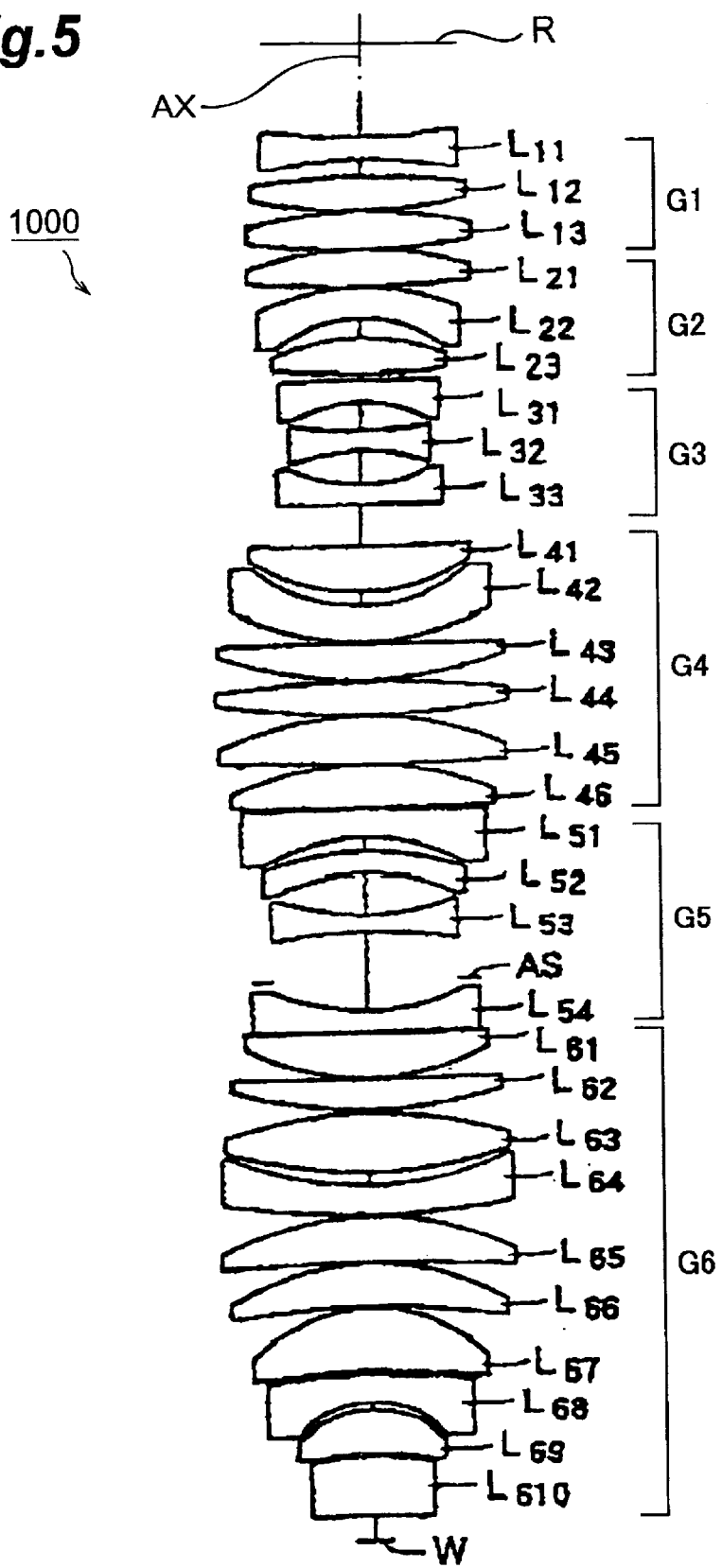
FIG. 5 shows a schematically drawn constitution of an example of a projection optical system constructed from silica glass members according to the present invention.

Then, an example of an optical system constructed by using silica glass members according to the present invention is described below. FIG. 5 shows a schematically drawn constitution of an example of a projection optical system constructed by using the silica glass members according to the present invention.

Referring to FIG. 5, a projection optical system 1000 consists of, sequentially from the reticle R side provided as the first article, a positive power first lens group G1, a positive power second lens group G2, a negative power third lens group G3, a positive power fourth lens group G4, a negative power fifth lens group G5, and a positive power sixth lens group G6. The constitution is provided telecentric with respect to the object side (reticle R side) and the image side (wafer W side), and yields a reduction ratio. The N. A. of the projection optical system is 0.6, and the magnification of projection is ¼.

In the present projection optical system, single crystals of calcium fluoride are incorporated at six portions of L45, L46, L63, L65, L66, and L67 to correct color aberration.

In the projection optical system constructed from the silica glass members according to the present invention, the distributions of the mean signed birefringence values within the plane vertical to the optical axis AX having a center at the crossing point with the optical axis AX for each of the optical members L11 to L610 are obtained in accordance with the calculation method based on formulae (1) and (2) above, and the signed characteristic birefringence value H of the entire optical system is calculated as explained below. Thus, the optical members are assembled with each other in such a manner that the projection optical system as a whole yields a signed characteristic birefringence value H falling in a range of from −0.5 to +0.5 nm/cm.

Figure 4A:
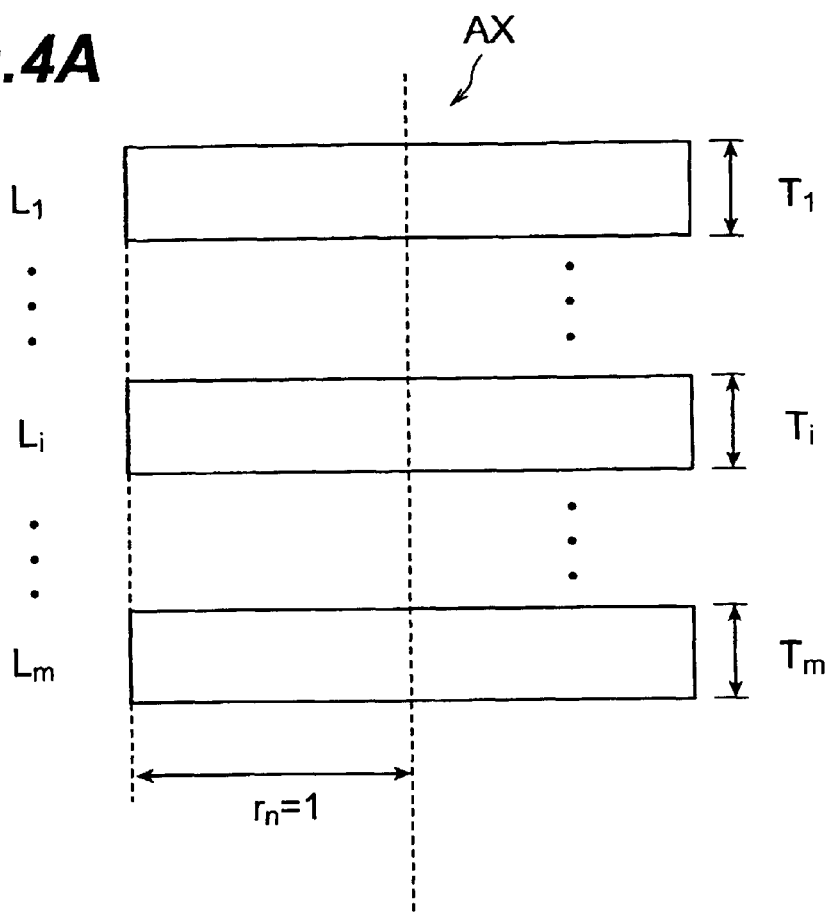
FIG. 4A is a side view of a plurality of silica glass members constituting an optical system.
Figure 4B:
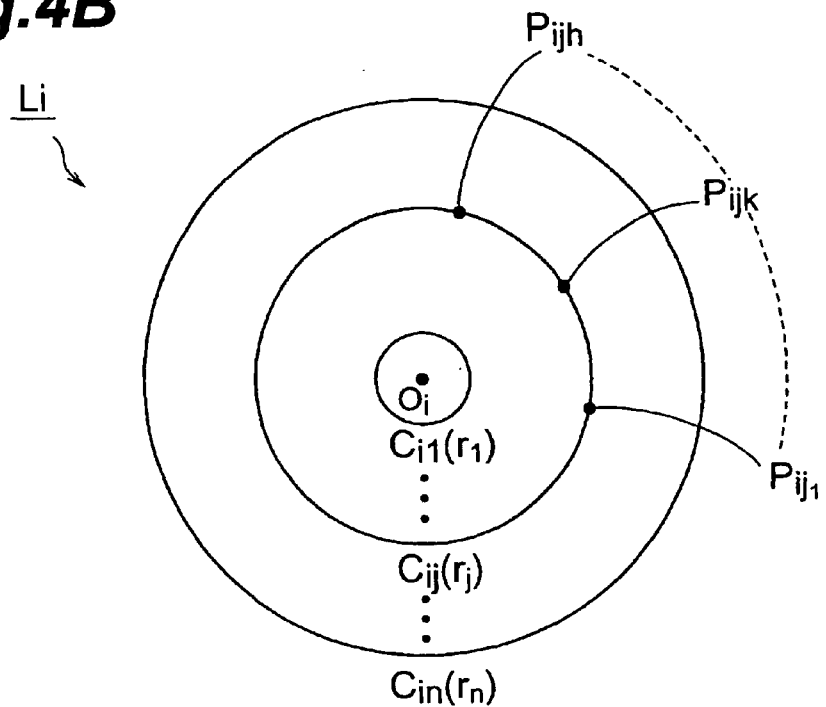
FIG. 4B is a cross section view of a silica glass member constituting the optical system shown in FIG. 4A.

The term "signed characteristic birefringence value H of the entire optical system" for an optical system constructed from the silica glass members according to the present invention is explained with reference to FIG. 4A and FIG. 4B.

Firstly, in accordance with the equation below, the quantity of mean signed birefringence $E_{ij}$ is calculated, which is the product of the mean signed birefringence value $B_{ij}$ measured for each of the silica glass member Li and the apparent thickness $T_i$ of the silica glass member Li:

$$E_{ij} = B_{ij} \times T_i \quad (3)$$

In the equation above, $T_i$ represents the apparent thickness of the silica glass member Li. As the apparent thickness, either a mean value of the thickness within the effective cross section of the silica glass member Li, or the effective thickness which results by matching the silica glass member Li with other members assembled on the upper and the lower position of the silica glass member Li in the optical system is properly selected.

Then, according to the following equation, the summation of the quantity of mean signed birefringence $E_{ij}$ for the entire optical system is divided by the total optical path length, D to calculate the average quantity of change $G_j$ of the signed birefringence values:

$$G_j = \frac{\sum_{i=1}^{m} E_{ij}}{D} \quad (4)$$

Where, D represents the apparent total optical path length of the entire optical system expressed by the following equation:

$$D = \sum_{i=1}^{m} T_i \quad (5)$$

Subsequently, in accordance with the equation below, the summation of the average quantity of change $G_j$ of the signed birefringence values for the entire optical system is divided by the number of concentrical circles, n, to calculate the signed characteristic birefringence value H of the entire optical system:

$$H = \frac{\sum_{j=1}^{n} G_j}{n} \quad (6)$$

In case the signed characteristic birefringence value H for the entire optical system thus obtained satisfies the following relation, the optical system as a whole exhibits an excellent imaging performance, and a projection aligner equipped with such an optical system realizes an excellent resolution:

$$-0.5 \leq H \leq +0.5 \text{ nm/cm} \quad (7)$$

By assembling each of the silica glass members in such a manner that the arrangement conditions based on the signed birefringence value described above are satisfied, the non-uniform distribution of birefringence values of each of the silica glass members can be quantitatively evaluated with particular reference to the direction of the fast axis, and, an optical system can be assembled while quantitatively predicting the signed characteristic birefringence value from the signed birefringence values for the silica glass members, such that the distribution of the birefringence values in each of the silica glass members can be cancelled out. Thus, a projection optical system having favorable imaging performance can be implemented.

Furthermore, in the projection optical system constructed from the silica glass members according to the present invention, it is preferred that the silica glass members are assembled with each other as such that the Strehl value of the signed birefringence value based on the effective optical path of the entire projection optical system is 0.93 or higher.

The present inventors have found that the use of a Strehl intensity for signed birefringence values while taking into account of the effective optical path for the center of the effective cross section of the silica glass member and the peripheral portion thereof is effective for the evaluation of the distribution in birefringence within a silica glass member. The Strehl value of the birefringence, which is introduced for the first time by the present inventors, takes into account of the effective optical path of the radiation passing through the effective cross section. Accordingly, by using it together with the evaluation using the signed birefringence characteristic value of the entire optical system, it is possible to make a further precise evaluation of the birefringence distribution within the silica glass member.

The conditions for arranging the silica glass members based on the Strehl value of the signed birefringence values can be expressed as follows:

$$0.93 \leq S \quad (8)$$

$$S = \prod_{i=1}^{m} S_i \quad (9)$$

$$S_i = 1 - \left(\frac{2\pi}{\lambda}\right)^2 \cdot \left(\frac{\sigma}{2} + \frac{|X|^2}{4}\right) \quad (10)$$

[wherein, in the formulae (7) to (9) above, $\lambda$ represents the wavelength of the light source; $\chi$ represents the mean value of the signed birefringence values determined from the distribution of the signed birefringence values with respect to the direction of the effective radius based on the effective optical path obtained for a silica glass member Li by a radiation trace test of the entire optical system; $\sigma$ represents the standard deviation of the signed birefringence values determined from the distribution of the signed birefringence values with respect to the direction of the effective radius based on the effective optical path obtained for a silica glass member Li by a radiation trace test of the entire optical system; $S_i$ represents the Strehl intensity of the signed birefringence values based on the effective optical path obtained for each of the silica glass members Li; and S represents the Strehl intensity of the signed birefringence values based on the effective optical path obtained for the entire optical system constructed by assembling all of the silica glass members Li.]

Further, the optical system constructed from the silica glass members according to the present invention preferably yields a maximum gradient $F_i$ for the distribution curve in the direction of the radius of the mean signed birefringence values $B_{ij}$ for each of the silica glass members Li of 0.2 nm/cm or lower per 10 mm of the width in the direction of the radius. By constituting the optical system using such silica glass members, a favorable imaging performance can be realized. Furthermore, a projection aligner equipped with such an optical system enables a uniform resolution over the entire plane of a wafer. The fact that the maximum gradient $F_i$ for the distribution curve in the direction of the radius of the mean signed birefringence values $B_{ij}$ is large signifies that not only the mean signed birefringence values $B_{ij}$ for the silica glass members, but also the signed birefringence values $A_{ijk}$ yield greatly scattered values. In case a light is irradiated to a silica glass member having a maximum gradient $F_i$ for the distribution curve in the direction of the radius of the mean signed birefringence values $B_{ij}$ of 0.2 nm/cm or greater per 10 mm of the width in the direction of radius, a disturbance in the wave plane of the light flux tends to generate as to greatly decrease the imaging performance of the optical system, because there is a large difference in the signed birefringence values $A_{ijk}$ depending on the position through which the light passes.

Then, the method for producing a silica glass member according to the present invention and the same for an optical system constructed from the silica glass members according to the present invention are described below. The explanation is made by taking a projection optical system to be used in a projection aligner as an example of an optical system constructed by the silica glass members.

Figure 6:
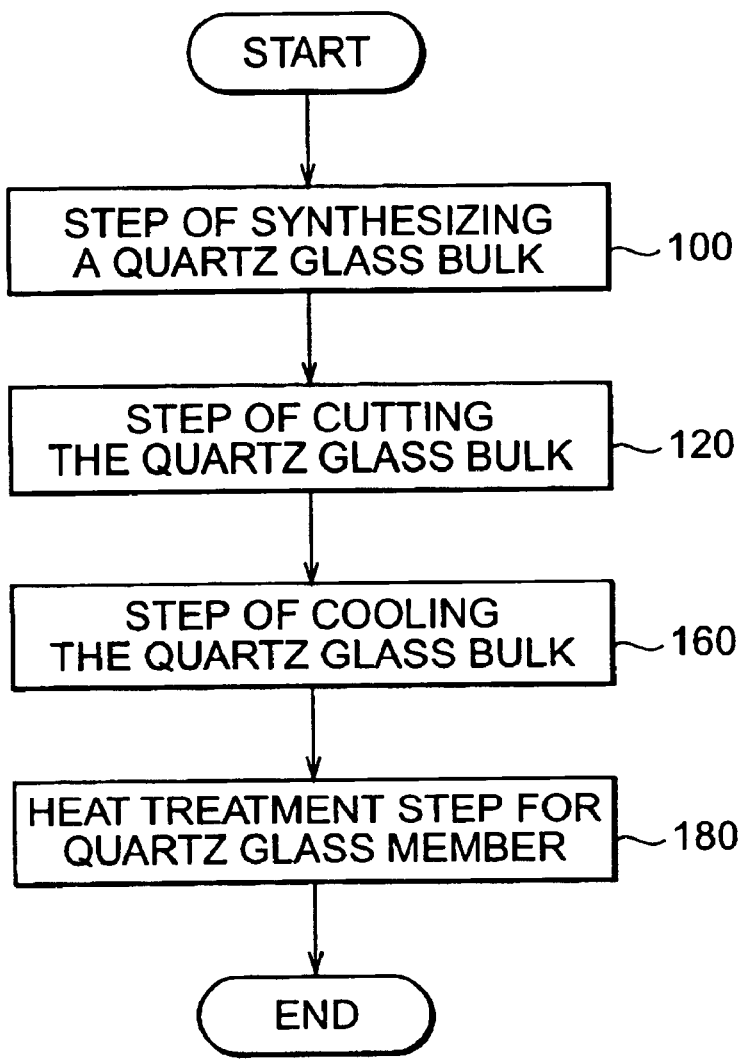
FIG. 6 is a flow chart showing an example of a process for producing a silica glass member according to the present invention.

FIG. 6 is a flowchart showing an example of the process for producing a silica glass member according to the present invention.

Referring to the figure, the method for producing a projection optical system constructed from the silica glass members according to the present invention comprises mainly a step of synthesizing a silica glass bulk 100 for synthesizing a silica glass bulk (a silica glass ingot), a step of cooling the silica glass bulk 120 for cooling the thus synthesized silica glass bulk, a step of heat treating the silica glass bulk 140 for heat treating the thus cooled silica glass bulk, a step of cutting the silica glass bulk 160 for cutting out a silica glass member from the thermally treated silica glass bulk, and a heat treatment step 180 for heat treating the thus cut out silica glass member.

In case of a general type of an optical glass, gradual cooling operation is performed to a fused and solidified glass to reduce the strain which generates inside the member. This operation removes the permanent strain remaining inside the member by slowly lowering the temperature of a once fused and solidified glass. In case of a multi-component system optical glass, for instance, the glass is once kept for a predetermined duration of time at a temperature sufficiently high, i.e., at a temperature not lower than the strain point (for an optical glass, commonly at several hundreds degrees Celsius), and is then cooled at a cooling rate as small as possible. In this manner, a nearly strain free glass can be obtained.

The reason why such a gradual cooling operation can be implemented is as follows. That is, while performing glass melting in case of producing an optical glass in general, stirring is applied to the glass in a molten state by using platinum stirring blades and the like for homogenization. Thus, the glass can be completely homogenized, and thereby enables a state without any fluctuation in thermal properties such as the thermal expansion. Accordingly, if glass can be cooled in a quasi-isothermal state for a infinitely long duration of time, in theory, a glass with zero strain is feasible.

However, it has been found that a silica glass exhibits a behavior completely different from that of the optical glass above obtained by fusion. The coefficient of thermal expansion for a silica glass is smaller than that of an optical glass by one digit. Theoretically, the degree of strain inside the silica glass should be more easily reduced as compared with the case of an optical glass. In many cases, in fact, despite of such understanding, internal strain which cannot be sufficiently removed remains inside a silica glass even in case such a gradual cooling operation is applied and cooled at an extremely low cooling rate well comparable to that employed in optical glasses.

The fact above is believed due to the non-uniform temperature distribution within the silica glass, the non-uniform distribution of impurities, or to the non-uniform structural distribution in $SiO_2$, which cannot be removed by an ordinary gradual cooling operation carried out in case of heat treatment during the step of synthesizing silica glass or in case of other heat treatments applied in the temperature range comparable thereto. For instance, if impurities should be present inside the silica glass bulk in a heterogeneous state, a heterogeneous distribution in the coefficient of thermal expansion attributed thereto is generates within the silica glass bulk. Thus, even if the silica glass bulk should be cooled over a sufficiently long duration of time, a difference in shrinking ascribed to the non-uniform distribution of the coefficient of thermal expansion occurs inside the silica glass bulk to generate the strain.

Moreover, in case of silica glass, viscosity decreases at an extremely high temperature, and the melting point is near to the temperature of volatilization. Thus, even if a molten state attempted to be achieved, complete homogenization by using stirring blades is unfeasible because vigorous volatilization proceeds at the same time.

In the light of such circumstances, in the stage of the step of synthesizing a silica glass bulk in the method for producing a silica glass member according to the present invention, attempts were made to synthesize a silica glass bulk as uniform as possible by attaining uniform distribution state for the impurities incorporated inside the bulk and uniform structural distribution of $SiO_2$.

Firstly, the step for synthesizing silica glass bulk 100 is described below.

The silica glass member for use in a projection optical system constructed from silica glass members according to the present invention is synthesized, for instance, by methods such as a) a method for obtaining a transparent silica glass, which comprises hydrolyzing a silicon compound in an oxyhydrogen flame, and, simultaneously with the deposition of fine glass particles on a target, vitrifying the deposit into a transparent glass; or b) a method for obtaining a transparent silica glass, which comprises obtaining fine glass particles (i.e., the so-called soot) by hydrolyzing a silicon compound in an oxyhydrogen flame, forming a porous glass (i.e., a so-called soot body) by depositing the soot, and making the soot body transparent by heating at a temperature not lower than that in the vicinity of the softening point (preferably, the melting point); etc.

The method a) above is known as a direct method, and the method b) is called a soot method. There is no particular limitation on the method for forming the porous glass in the soot method b), and usable are a VAD process, an OVD process, a sol-gel process, etc.

In the direct method and the soot method above, silicon compounds usable for the raw material include a siloxane such as hexamethyldisiloxane(HMDS), octamethylcyclotetrasiloxane(OMCTS), tetramethylcyclotetrasiloxane(TMCTS), etc.; an organic silicon compound such as a silane, e.g., methyltrimethoxysilane, tetraethoxysilane, tetramethoxysilane, etc.; a chloride of silicon, such as $SiCl_4$, $SiHCl_3$, etc.; a fluoride of silicon, such as $SiF_4$, $Si_2F_6$, etc.; and other silicon compounds such as $SiH_4$, $Si_2H_6$, etc. Among the silicon compounds enumerated above, the use of an organic silicon compound or a silicon fluoride is preferred because the incorporation of chlorine into the silica glass can be reduced, and because it tends to realize a silica glass having excellent resistance against ultraviolet radiations.

A method for producing a silica glass member by means of direct method (also known as a flame hydrolysis method) is described below.

Figure 7:
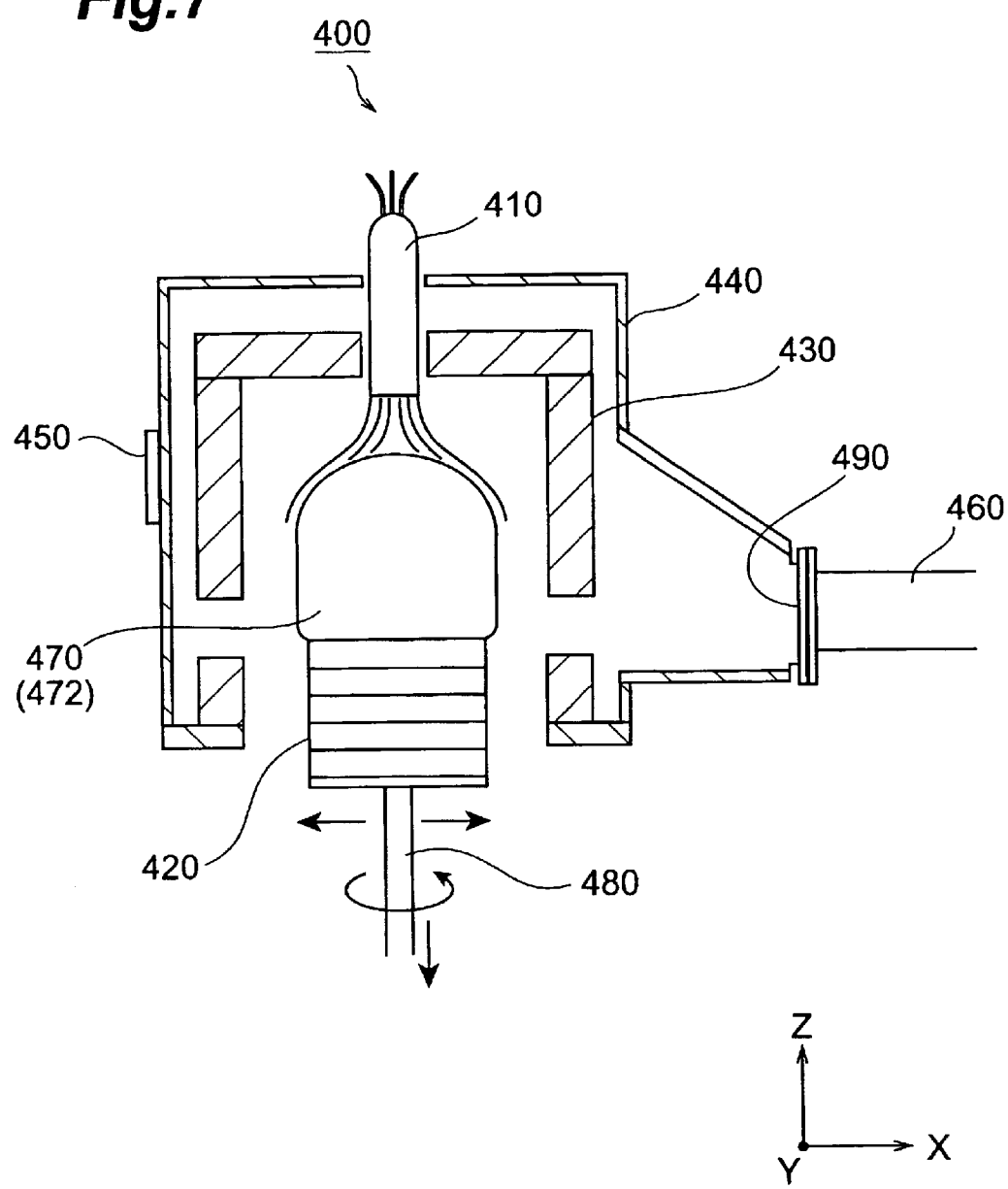
FIG. 7 shows a schematically drawn constitution of a synthetic furnace used in the present invention.

In FIG. 7 is shown a synthetic furnace 400 for use in the synthesis of a silica glass ingot 470 used in the present invention.

Referring to the figure, a silica burner 410 is of a multi-tubular structure, and is set as such that the front end thereof is pointed towards a target 420 from the upper portion of the furnace. The furnace wall consists of a furnace frame 440 and refractories 430, and is provided with an observatory window (not shown), a window 450 for an IR monitoring camera, and an outlet 490 connected to an evacuation pipe 460. In the lower portion of the furnace, there is provided a target 420 for forming a silica glass ingot 470, and the target 420 is connected to an external XY stage (not shown) via a support shaft 480. The support shaft 480 is provided rotatable by a motor, and the XY stage is movable in two dimensions, namely, in X direction and Y direction, by a X-axis servo motor and a Y-axis servo motor, respectively.

Figure 8:
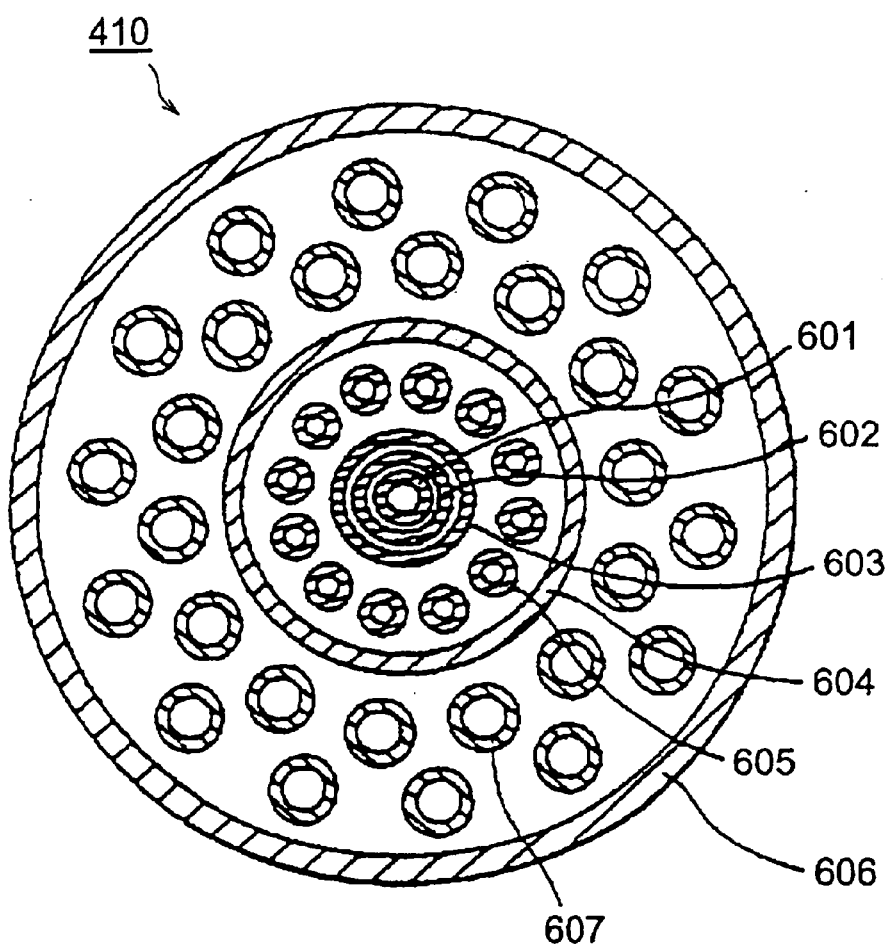
FIG. 8 shows a schematically drawn constitution of an example of a burner for use in the production of a silica glass member according to the present invention.

In FIG. 8 is shown schematically an example of the multi-tubular burner 410 shown in FIG. 7. The burner shown in FIG. 8 comprises a first tube 601 provided at the center, a second tube 602 provided concentrically around the first tube, a third tube 603 provided concentrically around the second tube, a fourth tube 604 provided concentrically around the third tube, a plurality of fifth tubes 605 provided between the outer periphery of the fourth tube and the internal periphery of the fourth tube, a sixth tube 606 provided concentrically around the fourth tube, and a plurality of seventh tubes 607 provided between the outer periphery of the fourth tube and the internal periphery of the sixth tube.

In case silicon halide is used as the raw material, silicon halide diluted with a carrier gas such as of nitrogen, helium, oxygen, hydrogen, etc., is ejected from the first tube 601. If silicon halide is provided in the form of a liquid at an ordinary temperature, the liquid is heated and gasified; if it is provided in the form of a gas at an ordinary temperature, it is introduced as it is into the first tube 601 together with the carrier gas after controlling its flow rate by using a mass flow controller. In case an organic silicon compound is used as the raw material, it is gasified by means of a vaporizer while controlling its flow rate by using a mass flow controller, and is introduced into the first tube 601 together with a carrier gas such as nitrogen, helium, etc. At this instance, depending on the type of the silicon compound, gaseous oxygen or gaseous hydrogen is ejected from a predetermined tube selected from the second tube 602 to the seventh tube 607 under predetermined conditions (i.e., flow rate, flow speed, etc.). More specifically, in case a silicon halide is used as the raw material, a silica glass according to the present invention can be favorably obtained by ejecting the gases in the order of oxygen, hydrogen, hydrogen, oxygen, hydrogen, and oxygen, from the inner side, i.e., from the side of the second tube 602. Further, in case an organic silicon compound is used as the raw material, a silica glass according to the present invention can be favorably obtained by ejecting the gases in the order of hydrogen, oxygen, hydrogen, oxygen, hydrogen, and oxygen, from the inner side, i.e., from the side of the second tube 602.

Referring to FIG. 8, explanation was made specifically on a burner equipped with a concentrically arranged quintuple tubes and a plurality of finer tubes arranged therebetween. However, a silica glass member according to the present invention can be favorably obtained by using a burner equipped with a concentrically arranged septuplet tubes and a plurality of finer tubes arranged therebetween.

Thus, a gas containing oxygen and a gas containing hydrogen are ejected from the burner 410, and by mixing, a flame is formed. Then, by ejecting a silicon compound as the raw material, which is diluted with a carrier gas, into the flame from the central portion of the burner, the raw material undergoes hydrolysis to generate fine particles of silica glass (soot). Thus, an ingot of a transparent silica glass can be obtained by depositing the soot on a rotating and vibrating target, while simultaneously applying melting and vitrification. At this moment, the upper portion of the ingot is covered by the flame, and the target is pulled downward in Z-direction as such that the position of the synthesizing plane at the upper portion of the ingot should be maintained at the same distance from the burner.

In the step of synthesizing silica glass bulk 100, the concentration of the hydroxyl groups as well as the distribution state of the hydroxyl groups within the silica glass bulk can be controlled by properly selecting the type of the gases (raw material as well as oxygen or hydrogen) ejected from each of the tubes of the multi-tubular burner, and by properly adjusting the ejecting conditions such as the flow rate.

More specifically, in addition to the control of the type of the gases (raw material as well as oxygen or hydrogen) ejected from each of the tubes of the multi-tubular burner 410 and the proper adjustment of the ejecting conditions such as the flow rate, the target 420 is vibrated as such that the vibration range should fall within 10 to 50% of the diameter of the ingot and that the vibration speed should be 100 mm/sec or lower. If the vibration range of the target 420 should be less than 10%, the resulting silica glass bulk tends to show large scattering in the concentration of hydroxyl groups; should the vibration range exceed 50%, on the other hand, it tends to cause difficulty in forming the silica glass bulk. Furthermore, if the vibration speed should exceed 100 mm/sec, there is a tendency to cause difficulty in forming the silica glass bulk. It should be noted that the vibration speed of the target 420 decreases to 0 mm/sec at the point the direction of movement is reversed. A reason why the target 420 is vibrated as above resides in the fact that, due to the chemical composition of the oxyhydrogen flame provided from the burner 410, the silica glass bulk 470 formed on the target inevitably contains hydroxyl groups within the structure of $SiO_2$ with some concentration and distribution. Thus, by changing the positional relation of the burner 410 and the synthetic plane (i.e., the plane on the upper portion of the silica glass bulk that is exposed to the oxyhydrogen flame) of the target 420, on which the silica glass bulk 470 is formed, under a constant condition, the hydroxyl groups incorporated into the silica glass bulk 470 formed on the target 420 can be uniformly dispersed as to prevent non-uniform distribution from occurring. By the vibrational movement of the target 420, the position of the synthetic plane of the silica glass bulk 470 formed on the target heated by the burner 410 can be continuously changed; thus, not only the distribution of impurities such as the hydroxyl groups incorporated into the silica glass bulk 470 can be homogenized, but also the temperature distribution can be effectively homogenized. As a result, the structural distribution of $SiO_2$ inside the silica glass bulk defined in the step of synthesizing the silica glass bulk 100 can be more effectively homogenized. In this instance, the target 420 may be subjected to a rotational movement only, while subjecting the burner 410 side alone to a XY vibrational movement. In this case again, a similar functional effect can be achieved.

In case the target 420 is not subjected to a XY vibrational movement, the temperature distribution as well as the distribution in the concentration of hydroxyl groups within the silica glass bulk can be homogenized by combusting the gas ejected by the burner 410 at a oxygen to hydrogen ratio in a side of excessive hydrogen, deviated from the theoretical air-fuel ratio of 1:2. Furthermore, by setting the portion touched by the oxyhydrogen flame in the silica glass bulk formed on the target 420 displaced by 5 mm or more, preferably, 15 mm or more, from the center of the target 420, the distribution in the concentration of hydroxyl groups as well as the structural distribution of $SiO_2$ within the silica glass bulk can be homogenized. By thus increasing the amount of displacement, the concentration of gaseous material supply to the central portion of the synthetic plane of the silica glass bulk can be prevented from occurring, and hence, the phenomenon of causing temperature drop at the synthetic plane can be circumvented. Thus, the distribution in the concentration of hydroxyl groups as well as the temperature distribution within the synthetic plane of the silica glass bulk can be maintained uniform. Furthermore, by carrying out the synthesis using a plurality of burners, the concentration of gaseous material supply to the central portion of the synthetic plane of the silica glass bulk can be prevented from occurring, and an effect similar to that achieved by displacing a single burner can be obtained.

It is further preferred that the target 420 is rotated at a rate of from 7.0 to 50 rpm. By thus controlling the speed of rotation, the distribution in the concentration of hydroxyl groups within the synthetic plane of the silica glass bulk can be effectively homogenized. If the speed of rotation of the target 420 should exceed 50 rpm, there occurs an inconvenience that less fine silica glass particles deposit on the target. If the rotation speed should be lower than 7.0 rpm, it tends to become difficult to homogeneously deposit the fine silica glass particles on the target.

The optimal speed of rotating the target 420 to effectively homogenize the distribution in the concentration of hydroxyl groups within the synthetic plane of the silica glass bulk also depends on the size of the diameter of the silica glass bulk being deposited on the target. For instance, in case the diameter of the silica bulk being deposited on the target is not larger than 200 mm, the target 420 is preferably rotated at a speed of from 20 to 50 rpm. Since the diameter of the silica bulk is relatively small in this case, it tends to become difficult to homogeneously deposit the fine silica glass particles on the target if the rotation speed of the target 420 decreases to a value lower than 20 rpm, and it thereby results unfeasible to obtain homogeneous distribution in the concentration of hydroxyl groups within the synthetic plane of the silica glass bulk. In case the diameter of the silica bulk being deposited on the target is larger than 200 mm, the target 420 is preferably rotated at a speed of from 7.0 to 20 rpm. Since the diameter of the silica bulk is relatively large in this case, a rotation speed of the target 420 exceeding 20 rpm causes an inconvenience as such that the amount of fine silica glass particles being deposited on the target results too few due to a too large a peripheral velocity for the outer peripheral portion of the silica bulk being deposited on the target. In case of synthesizing a silica bulk 200 mm or less in diameter, and then shaping it into a member exceeding a diameter of 200 mm, a member with a large diameter and still maintaining the as-synthesized distribution state in the concentration of hydroxyl groups can be produced by applying pressure deformation or thermal deformation to the silica glass bulk along the direction of growth.

Furthermore, a silica glass member having a signed birefringence value in a range of from −0.2 to +0.2 nm/cm for the portion in the vicinity of the center of the effective cross section of the silica glass member can be most simply obtained by producing a silica glass bulk with a large diameter, and cutting out therefrom a silica glass member having the desired diameter. In this case, it is essential to match the geometrical center of the silica glass bulk with that of the silica glass member. Since a silica glass bulk having a large diameter tends to yield a more flat distribution of the signed birefringence values as compared with a silica glass bulk smaller in diameter, the birefringence values of the silica glass member cut out therefrom also results in a flat distribution. This is believed attributed to the fact that the temperature gradient at the central portion of the synthetic plane of the silica glass bulk is smaller than that at the peripheral portion of the synthetic plane nearer to the side plane of the silica glass bulk.

Similarly, in case of producing a silica glass which does not have extremes of the distribution in the signed birefringence values at portions other than in the vicinity of the center of the effective plane, a silica glass bulk having a large diameter is produced at first, and after confirming the distribution in the signed birefringence values, a silica glass member is cut out therefrom in such a manner that no birefringence should be present at portions other than the central portion. Otherwise, an annealing operation, which comprises holding the silica glass bulk at a sufficiently high temperature which relaxes the birefringence and cooling gradually thereafter, may be applied to the silica glass bulk to obtain a silica glass member having a distribution in the signed birefringence values as such that it yields a birefringence of 0.2 nm/cm or less at the central portion and that no extremes are present at portions other than the central portion.

To obtain a silica glass member having a small scattering in the distribution of signed birefringence values within the member, such that the difference in the maximum and the minimum values of the signed birefringence values is 2.0 nm/cm or less, or that the maximum value of the gradient in the distribution of the signed birefringence values with respect to the direction of the radius is 0.2 nm/cm or less per a width of 10 mm, it is also effective to employ the method of cutting out the member from a silica glass bulk having a large diameter, or to carry out the annealing operation as above. In addition, it is also possible to minimize the scattering in the signed birefringence values by controlling the synthetic conditions, such as optimizing the temperature distribution in the upper portion (synthetic plane) of the silica glass bulk during its step of synthesizing the silica glass bulk.

The step of cooling the silica glass bulk 120 as shown in FIG. 6 is explained below.

In the step of cooling the silica glass bulk 120, silica glass bulk above is cooled in an inert gas atmosphere under a pressure region of from 0.01 to 0.15 MPa while controlling the cooling rate in the temperature range of from 1500 to 1800° C. to a range of from 5 to 10° C./min.

The thus synthesized silica glass bulk can be subjected to a viscous deformation in a high temperature region of 1800° C. or higher. Then, by controlling the cooling rate during cooling it to a temperature not higher than 1800° C., it is possible to homogenize the distribution state of the impurities such as hydroxyl groups and the structural distribution state of $SiO_2$ inside the silica glass bulk to a certain extent, although not thoroughly stirred as in the case of a general use optical glass. The distribution of impurities inside the silica glass bulk or the structural distribution in $SiO_2$ inside the silica glass bulk once generated in such a high temperature region cannot be completely removed by applying a gradual cooling operation in a temperature range lower than 1200° C. Accordingly, the final distribution state of the birefringence inside the silica glass bulk is determined by the heat treatment applied in the high temperature region not lower than 1200° C.

The present inventors have found that the degree of birefringence as well as its distribution state inside a silica glass member greatly depends on the cooling rate in the temperature region of from 1500 to 1800° C., more preferably, in the temperature region of from 1550 to 1650° C.

The distribution in the concentration of hydroxyl groups and the structural distribution of $SiO_2$ inside the silica glass bulk generated in the stage corresponding to the step of synthesizing a silica glass bulk cannot be completely removed in the later steps of heat treatment or of homogenization, but it is still possible to obtain a silica glass bulk having small degree of birefringence inside the silica glass bulk by controlling the temperature during cooling the silica glass ingot. Particularly important in this case is the cooling rate in the temperature region of from 1500 to 1800° C., more preferably, from 1550 to 1650° C., and the distribution in the concentration of hydroxyl groups contained inside the silica glass bulk as well as the structural distribution of $SiO_2$ inside the silica glass bulk established during the synthetic step can be relaxed to some extent by cooling the silica glass bulk in an inert gas atmosphere in the temperature region above under a pressure range of from 0.01 to 0.15 MPa (abs) while controlling the cooling rate to a range of from 0.1 to 10° C./min. Furthermore, to prevent the silica glass bulk from being subjected to an unnecessary compression stress or tensile stress during the step of cooling the silica glass bulk, the silica glass bulk is preferably placed alone (self-sustained) inside the synthetic furnace without providing any molding frames and molding vessels.

Even if cooling is performed at the temperature region higher than 1800° C. under the conditions above, the influence of cooling in this region is small because the thermal history in the temperature region of from 1500 to 1800° C. is dominating. Moreover, since the thermal history in the temperature region lower than 1500° C. can be adjusted by the annealing treatment in the later heat treatment step 180 for silica glass members, it is not necessarily required to control the cooling rate as above at temperature regions lower than 1500° C. Furthermore, if the cooling rate in the temperature region of from 1500 to 1800° C. should be lower than 0.1° C./min, there occurs inconveniences such as devitrification. On the other hand, if the cooling rate should exceed 10° C./min, there also occurs an inconvenience such as the generation of strain. In addition, if the partial pressure of the inert gas during this step of cooling the silica glass bulk should be lower than 0.01 MPa, unfavorable effects such as degasification and the like occur; on the other hand, should the partial pressure be higher than 0.15 MPa, unfavorable strain generates in the silica glass bulk.

Although not shown in FIG. 6, in case it is not possible to control the temperature of the silica glass bulk inside the synthetic furnace, or in case cooling of the silica glass bulk should be performed at a cooling rate higher than the range above, or in case the temperature control cannot be sufficiently applied during the step of cooling the silica glass bulk due to the limitations of the apparatus, the silica glass bulk may be once cooled to room temperature, taken out of the synthetic furnace, heated again to a predetermined temperature not lower than 1800° C. in a certain heat treatment apparatus, and cooled again in the temperature region of from 1500 to 1800° C. by setting the cooling rate in a range of from 0.1 to 10° C./min. Similarly in this case, it is possible to obtain a silica glass member which yields a mean signed birefringence value in a range of from −2.0 to +2.0 nm/cm for a plurality of measuring points. In the description above, if it is necessary to homogenize the internal temperature of the silica glass bulk to a certain temperature, for instance, in case the heating rate is relatively high, the silica glass bulk may be held for a predetermined duration of time when the silica glass bulk is re-heated to a predetermined temperature not lower than 1800° C.

Then, as shown in FIG. 6 as the step of cutting the silica glass bulk 160, a silica glass member having the desired shape and size is obtained by cutting out the silica glass bulk subjected to heat treatment.

It is possible to obtain a silica glass member which yields a mean signed birefringence value for a plurality of measuring points inside the member in a range of from −2.0 to +2.0 nm/cm by controlling the cooling rate in case cooling from 1800° C. or higher in the synthesis step or the cooling step after the synthesis as described above.

Next, it is possible to obtain a silica glass member having a desired shape and size by cutting out heat-treated silica glass bulk as is shown as the silica glass bulk cutting step 160 in FIG. 6.

The step of heat treatment step 180 for the silica glass member as shown in FIG. 6 is explained below.

In the step for cutting out the silica glass bulk 160, the scattering in signed birefringence values within the silica glass member is suppressed by applying a heat treatment which comprises sequentially rapid heating, holding the temperature for a short duration of time, and rapid cooling to the silica glass member cut out from the silica glass member. For instance, the silica glass member cut out from the silica glass bulk is first heated to a predetermined temperature of 1200° C. or lower. Then, if necessary, the thus cut out silica glass member is held at the temperature for a predetermined duration of time to homogenize the internal temperature. Then, the cooling rate in the predetermined temperature region of 1200° C. or lower is controlled to a predetermined value to perform the annealing treatment of the thus cut out silica glass member. In the description above, "a predetermined temperature of 1200° C. or lower" is a temperature known as a gradual cooling point in the temperature range of from 1000 to 1200° C. The annealing treatment reduces the size of birefringence within the silica glass bulk, and homogenizes the distribution state of the birefringence, but it is not possible to completely homogenize the strain distribution which was developed by the thermal history at temperatures higher than the temperature range of from 1500 to 1800° C. If the cooling rate after the annealing treatment should be too high, there occurs a phenomenon as such that the strain attributed to thermal stress remains inside the silica glass bulk. Accordingly, the cooling rate to a vicinity of 600° C. is set preferably at 1° C./min or lower, more preferably, at 0.5° C./min or lower.

In this manner, candidates for silica glass members having a variety of shapes which constitute the optical system as shown in FIG. 5 can be produced. More specifically, for instance, in case of producing a projection optical system as shown in FIG. 5, a plurality of silica glass lenses having the same shape and size as those of a silica glass lens L11 shown in FIG. 5 are produced.

In the method for producing a silica glass member according to the present invention, as described above, the internal distribution in the concentration of hydroxyl groups as well as the structural distribution of $SiO_2$ was controlled to a desired state in the stage of obtaining a silica glass bulk. However, there may be a case which comprises producing a silica glass bulk to which only the internal distribution in the concentration of hydroxyl groups is controlled, and then, applying the heat treatment to a prototype of a member obtained by cutting out the silica glass bulk.

The method for producing a silica glass member in the case above is described below by making reference to FIG.

6. Firstly, in the step of synthesizing a silica glass bulk 100, a silica glass bulk is synthesized by, in a synthetic furnace equipped with a burner having a plurality of tubes, ejecting a raw material and a combustion gas from the plurality of tubes of said burner to hydrolyze said raw material in an oxyhydrogen flame, and thereby synthesizing a bulk silica glass having a difference in the maximum and the minimum values of hydroxyl group concentration as measured in a plurality of points within a predetermined internal plane of the bulk of 50 ppm or lower. Then, in the cooling step 120 for the silica glass bulk, while holding said silica glass bulk inside said synthetic furnace, the silica glass bulk is cooled based on the temperature difference between the silica glass bulk and the temperature of the external environment without controlling the cooling rate. In the subsequent step of cutting the silica glass bulk 160, the silica glass bulk is cut out into a silica glass member having the desired shape and size.

Thus, the silica glass member whose internal distribution in the concentration of hydroxyl groups alone is controlled to a desired state is thermally treated in a later heat treatment step 180 for the silica glass member in a manner described below. First, in the first heat treatment step of the silica glass member not shown in FIG. 6, the silica glass member is placed inside an inert gas atmosphere in the pressure range of from 0.01 to 0.15 MPa (abs), and the temperature thereof is elevated to a predetermined temperature in a range of from 1600 to 2300° C. while controlling the heating rate in a range of from 1 to 10° C./min. Then, in the second heat treatment step for the silica glass member, the silica glass member is placed inside an inert gas atmosphere in the pressure range of from 0.01 to 0.15 MPa (abs), and the temperature thereof is lowered to a predetermined temperature in a range of from 1500 to 1800° C. while controlling the cooling rate in a range of from 5 to 10° C./min. In this manner, it is possible to obtain a silica glass member having such a distribution in difference between the maximum and the minimum values of hydroxyl group concentration as measured on a plurality of points within a plane vertical to an optical axis whose center is the crossing point of its optical axis with the optical axis of the silica glass member of 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

Figure 9:
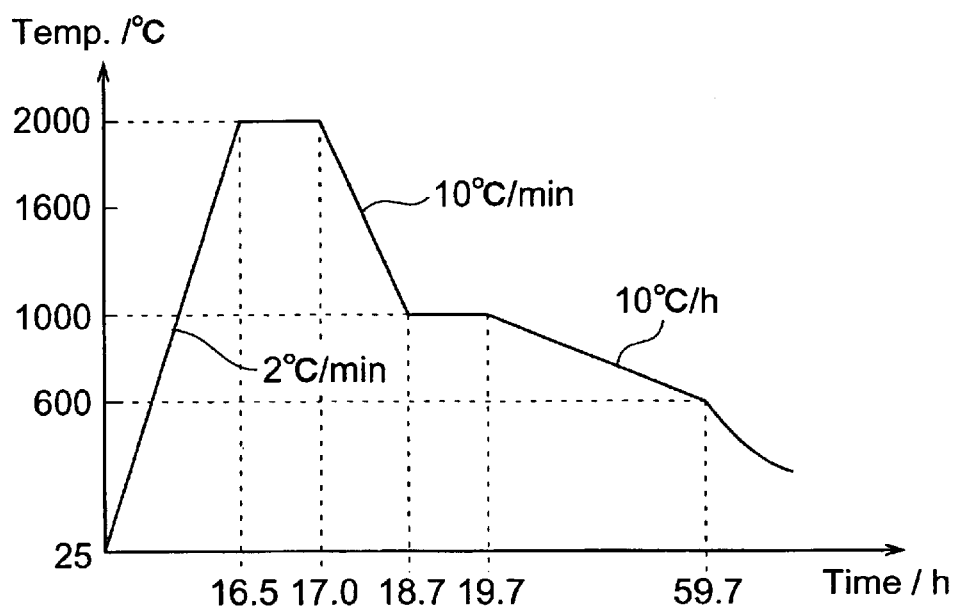
FIG. 9 is a profile showing the change of temperature with time inside a silica glass bulk subjected to heat treatment in each of the production steps in the process for producing a silica glass member according to the present invention.

If necessary, it is possible to further incorporate a thermal treatment step, as described below, in the heat treatment step 180 for the silica glass member. More specifically, a third heat treatment step for a silica glass member comprising holding the silica glass member for a predetermined duration of time in the temperature range of from 1600 to 2300° C. to sufficiently homogenize the internal temperature of the silica glass member, whose temperature was once elevated, may be incorporated between the first and the second heat treatment steps for the silica glass member. In FIG. 9 is a profile showing a change in the internal temperature of the silica glass bulk with the passage of time in case such a heat treatment based on the heat treatment step 180 for a silica glass member comprising such a third heat treatment step for a silica glass member is applied to the silica glass member.

In case a silica glass member produced in accordance with the production method for silica glass members according to the present invention is utilized as an optical member for use with a ultraviolet or a vacuum ultraviolet laser, the hydrogen molecules are preferably contained in the silica glass at a density of $5 \times 10^{17}$ molecules/cm$^3$ or higher. There is proposed a method for obtaining a silica glass member containing hydrogen molecules at a large quantity by controlling the hydrogen concentration in the silica glass member, however, due to the heat treatment that is performed at high temperatures in the range of 500° C. or higher after the synthesis, it is often a case that the hydrogen molecules inside the silica glass member are lost from the surface of the silica glass. Accordingly, in each of the process steps in the present invention, for instance, a thermal treatment or annealing treatment that is carried out with an aim to elevate the temperature of the silica glass bulk or the silica glass member with the purpose of performing hydrogen doping, the temperature is elevated, preferably, at a rate of 1° C./min or higher, more preferably, 2° C./min or higher, so as to avoid the diffusion and the discharge of hydrogen molecules from the surface of the silica glass. As described above, because the heat treatment or annealing treatment that is carried out with an aim to perform hydrogen doping and the like must prevent the phenomenon of residual strain ascribed to thermal stress from occurring, the cooling to about 600° C. after is preferably set at a rate of 1° C./min or lower, more preferably, 0.5° C./min or lower.

Furthermore, by applying the heat treatment according to the present invention to a silica glass bulk containing striae, not only it is possible to maintain the structural distribution of $SiO_2$ and the distribution in the concentration of hydroxyl groups inside the silica glass bulk at a desired state, but it is also possible to remove the striae. More specifically, the silica glass bulk containing the striae placed in the state of room temperature is subjected to a homogenization operation which accompanies viscous deformation of the silica glass bulk by heating the silica glass bulk again inside the synthetic furnace by using an oxyhydrogen burner, or by placing it inside an atmosphere-controlled furnace and heating again, to a temperature in the region of 1800° C. or higher. i.e., to the vicinity of the temperature employed in the synthetic step. Then, if necessary, the silica glass bulk is held for a predetermined duration of time in the temperature region not lower than 1800° C. Subsequently, cooling is carried out in the temperature range of 1500 to 1800° C. while controlling the cooling rate to 10° C./min. Thereafter, if necessary, annealing treatment is applied to the silica glass bulk in a predetermined temperature range of 1200° C. or lower. For instance, cooling is carried out in the temperature range of 1000 to 600° C. by controlling the cooling rate to 10° C./h.

Furthermore, even if the silica glass member thus obtained should contain striae, by applying the heat treatment to the silica glass member in the manner similar to the description above, it is possible to, not only maintain the structural distribution of $SiO_2$ and the distribution in the concentration of hydroxyl groups inside the silica glass member at a desired state, but also remove the striae.

Furthermore, in case the silica glass member according to the present invention is used together with a vacuum ultraviolet radiation laser having a wavelength of 180 nm or shorter, as described hereinbefore, the concentration of hydroxyl groups within the plane vertical to an optical axis whose center is the crossing point of its optical axis with the optical axis of the silica glass member is preferably. in a range of from 10 ppb to 50 ppm. Such a silica glass member can be produced by the soot method employing the VAD process.

More specifically, the method comprises obtaining fine glass particles (soot) by hydrolyzing a silicon compound in an oxyhydrogen flame, forming a porous glass (a soot body) by depositing the fine glass particles on a target, and, after applying a dehydration treatment to the porous glass, obtaining a silica glass ingot by converting the porous glass into a transparent body at a temperature in the vicinity of the softening point (preferably, the melting point) or higher.

In practice, the silica fine glass particles are synthesized by using a burner having a multi-tubular structure while selecting the type of the gases (the raw material as well as oxygen or hydrogen) ejected from each of the tubes and controlling the conditions (e.g., the flow rate, the flow speed, etc.) for ejecting them.

The silica glass thus obtained by the production method above preferably has a fluorine content of 0.5 wt. % or higher, and preferably, the distribution of the fluorine content is such that the difference between the maximum and the minimum content is 1.0 wt. % or lower. If the fluorine content is less than 0.5 wt. %, it tends to cause a failure in obtaining a sufficient optical transmittance due to the internal absorption exceeding 5%/cm per 1 cm of thickness, etc. If the distribution of fluorine content should be such that the difference in the maximum and the minimum content exceeds 1.0 wt. %, it tends to increase the fluctuation in transmittance.

The concentration of hydroxyl groups within the plane vertical to an optical axis whose center is the crossing point of its optical axis with the optical axis of the silica glass member is measured as follows.

First, a test piece is cut out from the center in the direction of the radius, and is polished to a thickness of 10 mm. Then, by using an infrared spectrophotometer, the absorbance is measured at a wavelength of 1380 nm or 2730 nm, i.e., at the wavelength assigned to the absorption of hydroxyl groups, and the distribution in the concentration of hydroxyl groups is obtained by calculation. In case a fair reproducibility is obtained for the production steps, it is not necessary to obtain the concentration of the hydroxyl groups within the plane vertical to an optical axis whose center is the crossing point of its optical axis with the optical axis of the silica glass member for each of the silica glass member thus obtained.

Figure 10:
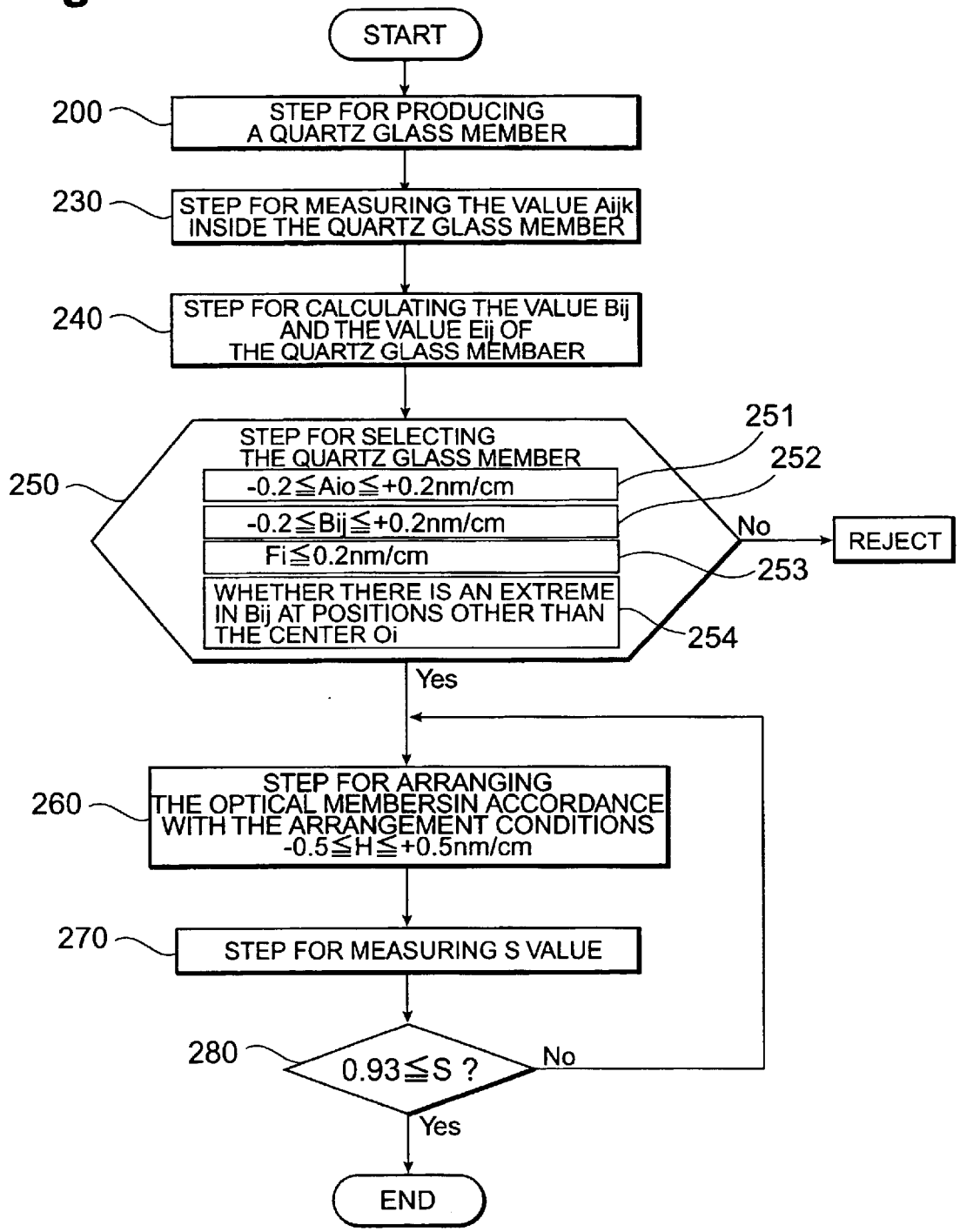
FIG. 10 is a flow chart showing an example of a process for producing a projection optical system constructed from silica glass members according to the present invention.

FIG. 10 is the flow chart showing an example of the method for producing an optical system constructed by using the silica glass members according to the present invention.

Referring to the figure, the method for producing a projection optical system constructed by using the silica glass members according to the present invention mainly comprises a step for producing a silica glass member 200, a step 230 for measuring the signed birefringence value $A_{ijk}$ inside the silica glass member thus obtained, a step 240 for calculating the quantity of mean signed birefringence value $E_{ij}$ from the thus obtained signed birefringence value $A_{ijk}$ and the mean signed birefringence value $B_{ij}$, a step 250 for selecting the silica glass member to be used in the optical system by taking the distribution data for the signed birefringence values within the silica glass member thus obtained in step 240 into consideration, a step 260 for arranging the plurality of silica glass members thus selected in step 250 in accordance with the arrangement conditions based on the characteristic birefringence values for the entire projection optical system, a step 270 for measuring the Strehl value of the signed birefringence values based on the effective optical path of the projection optical system thus assembled in step 260, and a step 280 for rearranging the silica glass members in accordance with the arrangement conditions based on the Strehl value thus obtained in step 270.

Now, based on the flow chart given in FIG. 10, the method for producing the projection optical system constructed from the silica glass members according to the present invention is described in detail below.

First, in step 200, a plurality of silica glass members produced in accordance with the method for producing the silica glass member according to the present invention with reference to FIG. 6 are prepared.

In step 230, the signed birefringence value is measured for each of the plurality of silica glass members thus prepared. More specifically, the signed birefringence value $A_{ijk}$ is measured for each of the plurality of the measuring points $P_{ijk}$ that are taken on a plurality of virtual concentrical circles located in the effective cross section perpendicular to the optical axis of the silica glass member.

The method for measuring birefringence employed in the present invention is described below. First, explanation is made on the phase modulation method. The optical system is obtained by arranging a light source, a polarizer, a phase modulator, a specimen, and a photo detector. A He-Ne laser or a laser diode is used as the light source, and a photoelastic converter is used as the phase modulator. The light emitted from the light source is converted into a linear polarized light upon passing through the polarizer, and is provided as an incident light to the phase modulator. The light flux projected onto the specimen from the phase modulator is a modulated light whose polarized state changes continuously in the sequence of a linear polarized light to a circularly polarized light, and again to a linear polarized light. On carrying out the measurement, the specimen is rotated around the light flux incident to the measuring point of the specimen, and the amplitude of modulation is measured after finding the peak output of the detector. Thus, the direction of fast axis (slow axis) and the size of the phase difference of birefringence are obtained. It is also possible to perform a measurement without rotating the specimen if a Zeeman laser is used as the light source. Furthermore, a phase shift method and an optical heterodyne interference method are also applicable in the present invention.

In addition, it is also possible to perform measurements described below, but the measurement precision is inferior.

In case of rotary analyzer method, the apparatus is constructed as such that the specimen placed between the light source and the optical detector is sandwiched with a polarizer and a rotary analyzer. The signal from the detector is measured while rotating the analyzer placed on the back of the specimen, and the phase difference is obtained from the maximum and the minimum values of the signal sent out from the detector.

In case of carrying out a phase compensation method, a light source, a polarizer, a specimen, a phase compensator, an analyzer, and an optical detector are set. The axes of in the polarizer and the analyzer are set to be cross at right angles with each other. Since the linear polarized light incident to the measuring specimen is converted into an ellipsoidal polarized light by the birefringence of the specimen, a phase compensator is adjusted to convert it again to the linear polarized light. By adjusting the compensator, a nearly zero signal can be realized at the detector. The phase compensation value which achieves the best extinction is the quantity of birefringence.

If the specimen to be measured is sufficiently thick, a measurement is also possible by using a simple comparative method comprising using a standard sample by using an optical system consisting of crossed nicols.

The measured values of birefringence are expressed with signs; as described above, a positive (+, plus) sign is attached if the direction of the fast axis is in parallel with the diameter of the member, and a negative (−, minus) sign is attached if it is perpendicular to the diameter of the member. In case the measured birefringence value is small, the fast axis is not always completely in parallel or perpendicular to the diameter, but may be somewhat tilted. In such a case, those having a tilting angle smaller than 45° with respect to the diameter are treated by attaching the positive sign (+), and those nearer to a perpendicular relation are treated by attaching a negative sign (−)

In step 240, the mean signed birefringence value $B_{ij}$ is obtained from the signed birefringence values $A_{ijk}$ obtained for each of the silica glass members Li obtained in step 230. The mean signed birefringence value $B_{ij}$ as referred herein is the arithmetic mean of the plurality of signed birefringence values obtained for the plurality of measuring points located on the concentrical circles $C_{ij}$ disposed at the same distance $r_j$ from the center $O_i$ of the effective cross section.

By making reference to FIG. 11A, FIG. 11B, FIG. 12A, FIG. 12B, FIG. 13A, and FIG. 13B, the case of obtaining mean signed birefringence value $B_{ij}$ from the signed birefringence values $A_{ijk}$ is described below.

Figure 11A:
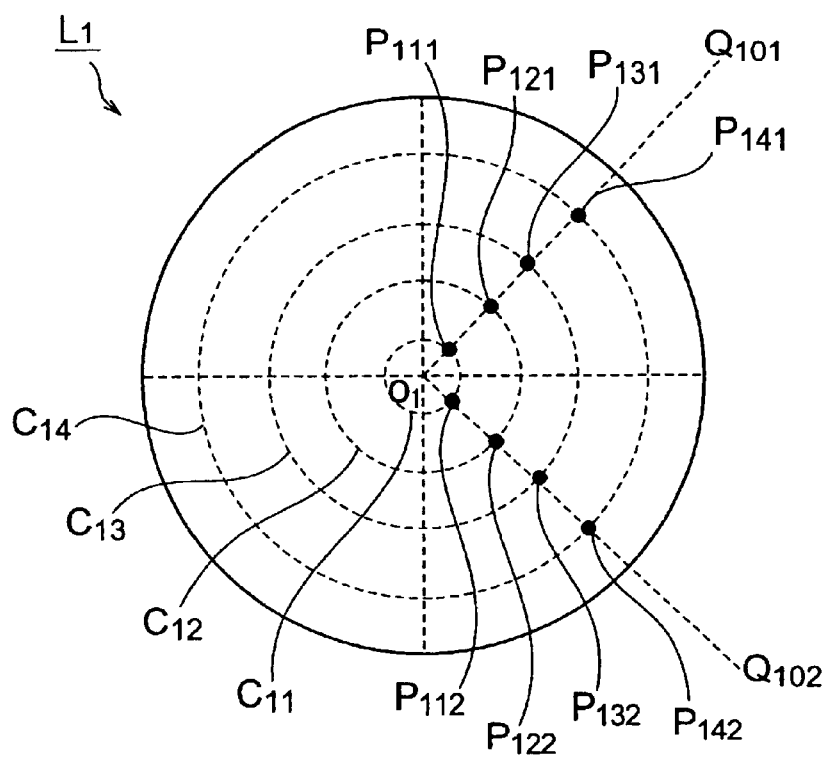
FIG. 11A is a cross section view of an optical member showing the points for measuring signed birefringence values inside an optical member constituting a projection optical system according to the present invention.
Figure 11B:
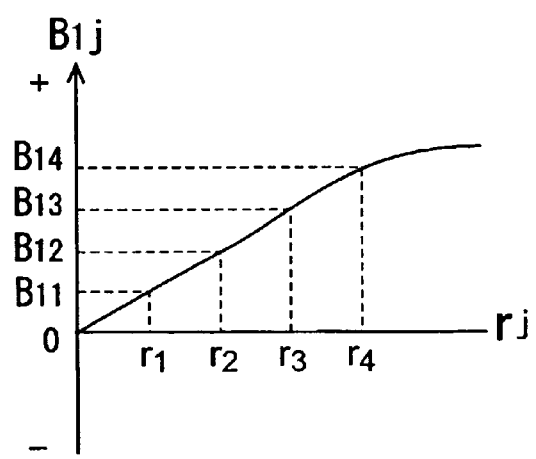
FIG. 11B is a graph showing the distribution of mean signed birefringence values within the optical member shown in FIG. 11A.

FIG. 11A is a schematic diagram showing the measuring points $P_{111}$, $P_{121}$, $P_{131}$, $P_{141}$, $P_{112}$, $P_{122}$, $P_{132}$, and $P_{142}$, each obtained by taking the crossing points of the two straight lines $Q_{101}$ and $Q_{102}$ each extending from the center $O_1$ in the direction of the radius, and the concentrical circles $C_{11}$, $C_{12}$, $C_{13}$, and $C_{14}$, each having a radius of $r_1$, $r_2$, $r_3$, and $r_4$ with respect to the center $O_1$ located on the effective cross section taken on a silica glass member L1. In this case, the arithmetic mean for the signed birefringence values obtained from two measuring points located on the circumference of the same concentrical circle becomes the mean signed birefringence value for each of the concentrical circles of the silica glass member L1. More specifically,in case of a concentrical circle $C_{11}$, the arithmetic mean for the signed birefringence values $A_{111}$ and $A_{112}$ obtained at the measuring points $P_{111}$ and $P_{112}$ located on the circumference of the concentrical circle $C_{11}$, corresponds to the mean signed birefringence value $B_{11}$ that represents the signed birefringence values for the point groups located on the circumference of the concentrical circle $C_{11}$. Similarly, the mean signed birefringence values $B_{12}$ to $B_{14}$ can be obtained for the concentrical circles $C_{12}$ to $C_{14}$. Then, by graphically expressing the mean signed birefringence values $B_{11}$ to $B_{14}$ as a function of the distance from the center $O_1$, the distribution of the mean signed birefringence values in the direction of the radius of the silica glass member L1 can be quantitatively understood. For instance, if the mean signed birefringence values $B_{11}$ to $B_{14}$ all yield a positive value and show a monotonous increase in the radius direction, a profile shown in FIG. 11B can be obtained for the mean signed birefringence values with respect to the radius direction of the silica glass member L1.

Figure 12A:
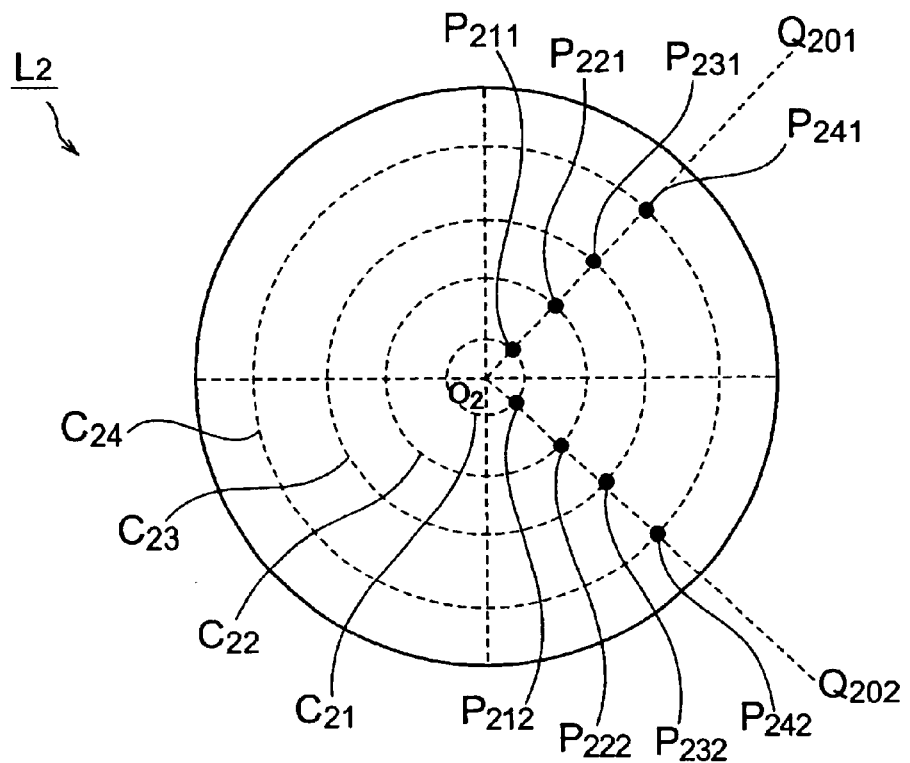
FIG. 12A is another cross section view of an optical member showing the points for measuring signed birefringence values inside an optical member constituting a projection optical system according to the present invention.
Figure 12B:
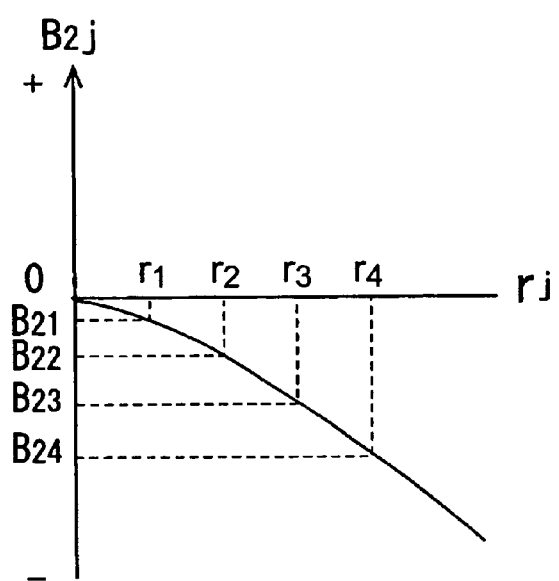
FIG. 12B is a graph showing the distribution of mean signed birefringence values within the optical member shown in FIG. 12A.

FIG. 12A is a schematic diagram showing the measuring points $P_{211}$, $P_{221}$, $P_{231}$, $P_{241}$, $P_{212}$, $P_{222}$, $P_{232}$, and $P_{242}$, each obtained by taking the crossing points of the two straight lines $Q_{201}$ and $Q_{202}$ each extending from the center $O_2$ in the direction of the radius, and the concentrical circles $C_{21}$, $C_{22}$, $C_{23}$, and $C_{24}$, each having a radius of $r_1$, $r_2$, $r_3$, and $r_4$ with respect to the center $O_2$ located on the effective cross section taken on a silica glass member L2. In this case again, as described above with reference to FIG. 11A, the mean signed birefringence values $B_{21}$ to $B_{24}$ can be obtained for the concentrical circles $C_{21}$ to $C_{24}$. Then, by graphically expressing the mean signed birefringence values $B_{21}$ to $B_{24}$ as a function of the distance from the center $O_2$, the distribution of the mean signed birefringence values in the direction of the radius of the silica glass member L2 can be quantitatively understood. For instance, if the mean signed birefringence values $B_{21}$ to $B_{24}$ all yield a negative value and show a monotonous decrease in the radius direction, a profile shown in FIG. 12B can be obtained for the mean signed birefringence values with respect to the radius direction of the silica glass member L2.

Figure 13A:
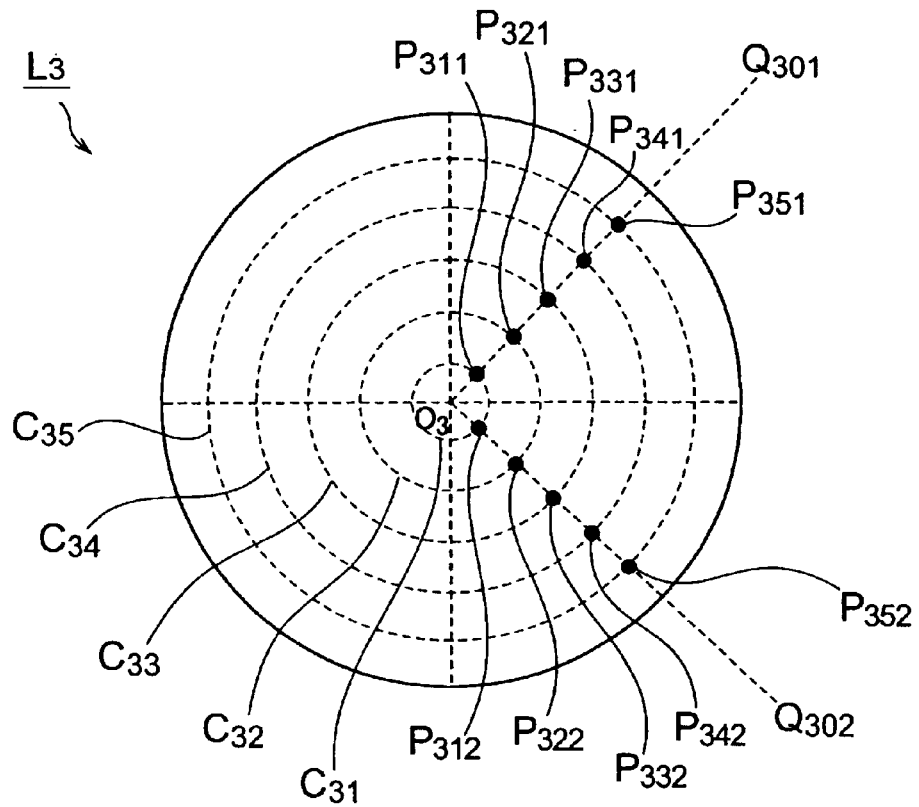
FIG. 13A is a still other cross section view of an optical member showing the points for measuring signed birefringence values inside an optical member constituting a projection optical system according to the present invention.
Figure 13B:
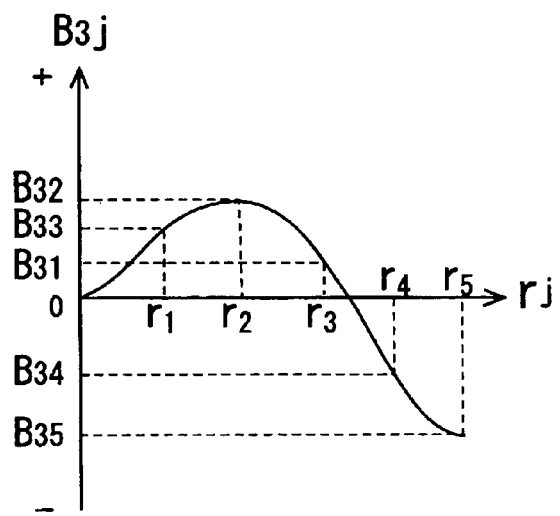
FIG. 13B is a graph showing the distribution of mean signed birefringence values within the optical member shown in FIG. 13A.

FIG. 13A is a schematic diagram showing the measuring points $P_{311}$, $P_{321}$, $P_{331}$, $P_{341}$, $P_{351}$, $P_{312}$, $P_{322}$, $P_{332}$, $P_{342}$, and $P_{352}$, each obtained by taking the crossing points of the two straight lines $Q_{301}$ and $Q_{302}$ each extending from the center $O_3$ in the direction of the radius, and the concentrical circles $C_{31}$, $C_{32}$, $C_{33}$, $C_{34}$, and $C_{35}$, each having a radius of $r_1$, $r_2$, $r_3$, $r_4$, and $r_5$ with respect to the center $O_3$ located on the effective cross section taken on a silica glass member L3. In this case again, as described above with reference to FIG. 11A, the mean signed birefringence values $B_{31}$ to $B_{35}$ can be obtained for the concentrical circles $C_{31}$ to $C_{35}$. Then, by graphically expressing the mean signed birefringence values $B_{31}$ to $B_{35}$ as a function of the distance from the center $O_3$, the distribution of the mean signed birefringence values in the direction of the radius of the silica glass member L3 can be quantitatively understood. For instance, if the mean signed birefringence values $B_{31}$ to $B_{33}$ yield a positive value while the mean signed birefringence values $B_{34}$ and $B_{35}$ yield a negative value, and, if the mean signed birefringence values $B_{31}$ to $B_{33}$ exhibit a maximum in the vicinity of $r_2$ with a monotonous decrease along the radius direction from $r_2$ to $r_5$, a profile shown in FIG. 13B can be obtained for the mean signed birefringence values with respect to the radius direction of the silica glass member L3.

Furthermore, in step 240, a quantity of mean signed birefringence value $E_{ij}$ for each of the silica glass members are obtained in accordance with equation (3) by using the mean signed birefringence values $B_{ij}$ for each of the silica glass members and apparent thickness $T_i$ for each of the silica glass members.

In step 250, the silica glass members are selected for use in the optical system. In this case, as is shown in the projection optical system in accordance with FIG. 5, since the silica glass members each differ in its effective cross section depending on its role when assembled into the projection optical system, the effective cross sections thereof are each normalized as such that the maximum effective radius should be 1 for each of the silica glass members as described above with reference to FIG. 4A. Then, based on the thus normalized common effective radius, the distribution of the mean signed birefringence values $B_{ij}$ for all of the silica glass members in the direction of the radius is studied to select the silica glass members as follows. In this manner, the candidates for use as the silica glass members in each of the portions constituting the projection optical system are selected.

The conditions for selecting the silica glass members in this step 250 are as follows. Selection condition 251: that the signed birefringence value in the vicinity of the center Oi of a silica glass member Li is 0.2 nm/cm or less; selection condition 252: that the mean signed birefringence value $B_{ij}$ for a plurality of portions within the plane vertical to the optical axis having a center at the crossing point with the optical axis of the silica glass member Li falls in a range of from −2.0 to +2.0 nm/cm; selection condition 253: that the maximum gradient $F_i$ for the distribution curve in the direction of the radius of the mean signed birefringence values $B_{ij}$ for each of the silica glass members Li is 0.2 nm/cm or lower per 10 mm of the width in the direction of the radius; and selection condition 254: that in a silica glass member Li, the distribution in mean signed birefringence values $B_{ij}$ in the radius direction shows no extremes at points other than the center $O_i$.

By using a silica glass member which satisfies all, or at least one, of the selection conditions 251 to 254 above, a projection optical system having a high imaging performance can be constructed with higher efficiency.

In step 260, the silica glass members are arranged in such a manner that the entire projection optical system shown in (7) above yields a signed characteristic birefringence value H falling in a range of from −0.5 to +0.5 nm/cm. In this instance, the signed characteristic birefringence value H of the entire projection optical system is calculated in accordance with equations (5) to (6). The projection optical system having such an arrangement exhibits an excellent imaging performance.

In step 280, the silica glass members are assembled in such a manner that the projection optical system as a whole yields a Strehl value which satisfy the arrangement condition, such that the Strehl value of the signed birefringence values based on the effective optical path for the entire projection optical system may become 0.93 or higher. Since the Strehl value of the birefringence takes the effective optical path of the radiations passing through the effective cross section into consideration, a further precise evaluation can be performed on the distribution of birefringence within the silica glass member by combining it with the evaluation based on the signed characteristic birefringence value of the entire optical system. The Strehl value of the birefringence, S, is calculated in accordance with equations (9) and (10) by using the data on the distribution of signed birefringence values in the radius direction obtained by ray track test.

For instance, in case of a projection optical system 1000 shown in FIG. 5, while omitting the lenses produced from single crystals of calcium fluoride, namely L45, L46, L63, L65, L66, and L67, the measured results for the distribution of signed birefringence values corresponding to the silica glass lenses L11 to L610 with respect to the radius direction are input into a computer for calculating the Strehl value. Then, by a means similar to ray tracking used in the calculation of, for example, the aberrations of an optical system such as on the optical axis, near axis region, outside the axis, etc., the points through which the radiations pass on each of the lenses are obtained for the lenses, and the signed birefringence values corresponding to the points are substituted into equation (10) to obtain the Strehl value. That is, a plurality of Strehl values corresponding to a plurality of radiations incident to the projection optical system 1000 at various incident angles are obtained, and the minimum value of the thus obtained values is selected as the Strehl value of the combination of the samples.

With respect to the distribution of the signed birefringence of the six lenses produced from the single crystals of calcium fluoride, the theoretical values therefor may be input into the computer, or a value measured on a material having a standard distribution in birefringence values may be input. Otherwise, the material for these six lenses may be produced simultaneously so that they may be evaluated together with the silica glass lenses.

In the method for producing the projection optical system above, the explanation has been made specifically to a case comprising the step 250 for selecting the silica glass member, the step 270 for measuring the Strehl value, and the step 280 for arranging the silica glass members in accordance with the Strehl value. However, the method for producing a projection optical system constructed from the silica glass members according to the present invention is not only limited to the embodiment above. In the method for producing a projection optical system constructed from the silica glass members according to the present invention, the three steps above can all be omitted.

Furthermore, in the explanation above, the measured distribution of the mean signed birefringence values $B_{ij}$ in the radius direction for each of the silica glass members yield a value of approximately zero in the vicinity of the center for all of the silica glass members, and the distribution of the mean signed birefringence values $B_{ij}$ shows a slight monotonous increase or decrease in the radius direction. In such a case, instead of using the signed characteristic birefringence value of the entire projection optical system above, a value calculated in accordance with the method below can be used as a standard for evaluating the influence of the birefringence of the entire projection optical system. More specifically, this value is obtained by taking an arithmetic mean of the mean signed birefringence values $B_{ij}$ along the radius direction inside the silica glass member as a signed birefringence value representing the member, and by then taking the summation of the values for all of the silica glass members. Thus, the members can be easily selected with the influence of birefringence being taken into consideration by assembling the members in such a manner that the summation above should yield a value of zero for the entire optical system.

Figure 14:
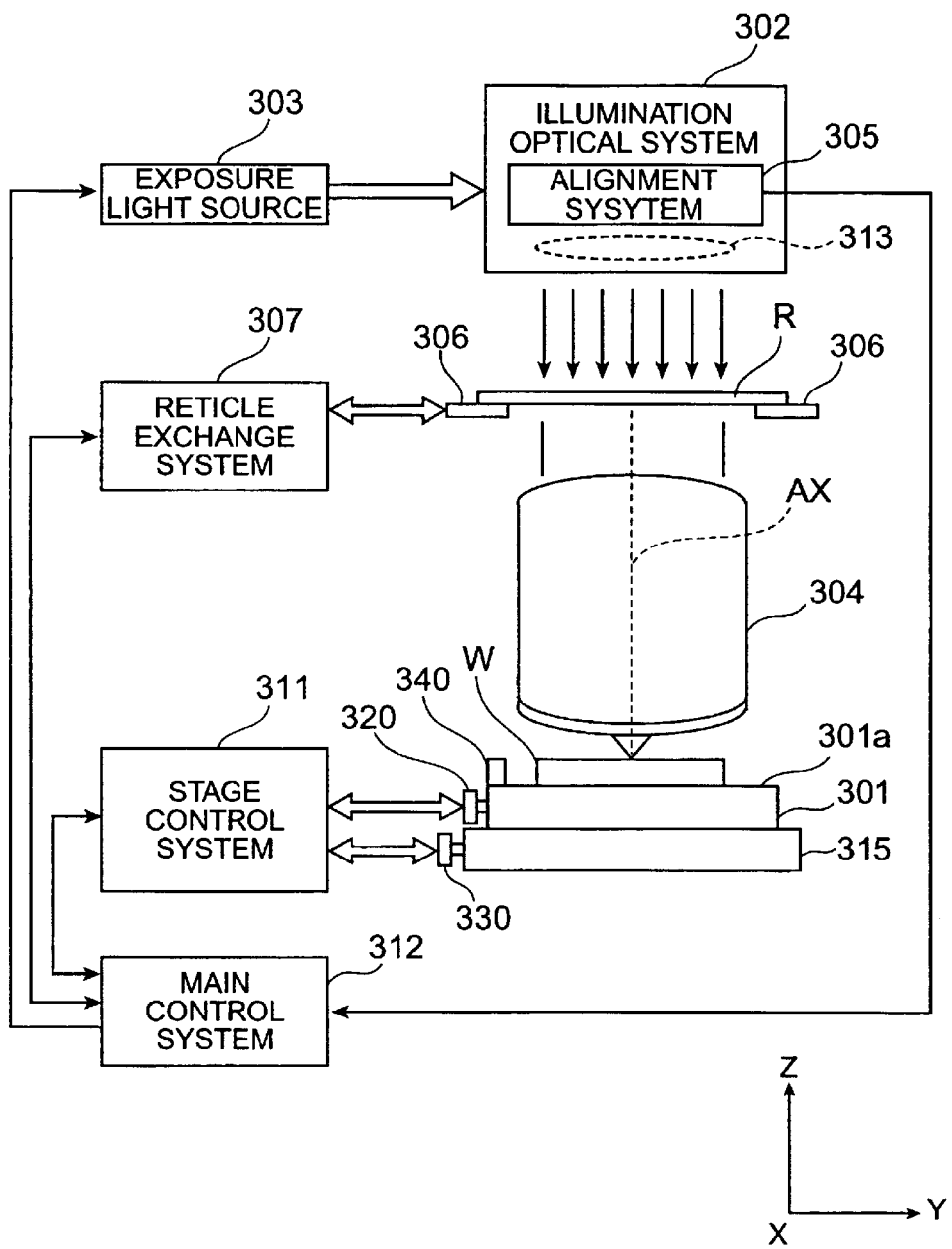
FIG. 14 shows a schematically drawn constitution of an example of a projection aligner according to the present invention.

FIG. 14 shows a schematically drawn constitution of an example of a projection aligner equipped with a projection optical system constructed from the silica glass members according to the present invention. Referring to FIG. 14, the direction in parallel with the optical axis of the projection optical system 304 is taken as the Z direction, the direction perpendicular to the Z direction and in the plane of the paper sheet is taken as the Y direction, and the direction perpendicular to the paper sheet and the Z direction is taken as the X direction.

The projection aligner shown in FIG. 14 mainly comprises an exposure light source 303, a reticle R having formed thereon an original pattern image, an irradiation optical system 302 which irradiates a radiation output from said exposure light source 303 to said reticle R, a projection optical system 304 which projects a pattern image output from said reticle R onto a wafer (photosensitive substrate) W, and an alignment system 305 which aligns said reticle R and said wafer W.

The wafer W is mounted on a leveling stage (not shown), and the leveling stage is installed on a Z stage 301 movable by a driving motor 320 in the direction of the optical axis (Z direction) of the projection optical system. The Z stage 301 is mounted on a XY stage 315 of a step-and-repeat type, and is provided movable by a driving motor 320 in two dimension (XY). The reticle R is mounted on a reticle stage 306 movable in two dimension in the horizontal plane. The exposure light emitted from the exposure light source 303 uniformly illuminates the pattern formed on the reticle R via an illumination optical system 302, and the pattern image on the reticle R is exposure transferred to the shot region of the wafer W by the projection optical system 304. As the exposure light, there can be used radiations having a wavelength of 248 nm (KrF excimer laser), 193 nm (ArF excimer laser), or 157 nm ($F_2$ laser).

Once the transfer exposure of a pattern on the reticle R corresponding to one shot region on the wafer W is completed, the XY stage 315 is moved in accordance with the stepping movement to the next shot region on the wafer W in such a manner that the shot region is aligned with the exposure region of the projection optical system 304. The two dimensional position of the leveling stage, on which the wafer W is mounted, is continuously monitored at a resolution power of, for instance, about 0.01 µm, by using a laser interferometer (not shown), by measuring the distance with respect to the movable mirror 340 fixed on the leveling stage. The output from the laser interferometer is supplied to the stage control system 311.

The reticle R is aligned on the reticle stage 306 in such a manner that the center of the transfer pattern on the reticle R may be matched with the optical axis AX of the projection optical system 304. The aligning of the reticle R is performed by using a plurality of the reticle alignment marks (reticle marks) provided to the outer periphery of the reticle R. The reticle marks comprise two types of marks, namely, the reticle marks for aligning in the X direction, and the reticle marks for aligning in the Y direction. The alignment system 305 uses an exposure light taken out by branching a part of the exposure light emitted from the exposure light source 303 as the illuminating light (alignment light). The alignment system 305 is each provided at a position corresponding to each of the reticle alignment marks.

The illumination light passed through the illumination optical system 302 then enters the reticle mark provided at the outside of the pattern region of the reticle R as an incident light. The reticle mark is provided, for instance, as a square transparent window formed on the opaque portion surrounding the pattern. The alignment light reflected at the reticle mark portion reenters the alignment system 305 as an incident light. On the other hand, the alignment light passed through the reticle mark passes through the projection optical system 304, and becomes an incident light on the substrate alignment mark (wafer mark) provided to the periphery of each of the shot regions on the wafer W. The wafer marks need not be provided to the periphery of each of the shot regions, but may be provided at a predetermined position of the wafer, for instance, to the outer peripheral region of the wafer. The wafer marks also consist of two types, namely, the wafer marks for aligning in the X direction, and the wafer marks for aligning in the Y direction. The light reflected at the wafer marks tracks back the path of the incident light, and reenters the alignment system 305 after passing through the projection optical system 304 and the reticle mark portion.

In this manner, the alignment system 305 detects the relative position of the reticle R and the wafer W by inputting the alignment light reflected at the reticle R and the wafer W. The output from the alignment system 305 is supplied to the main control system 312. Then, by supplying the output from the main control system 312 to the reticle exchange system 307 and the stage control system 311, the spatial alignment of the reticle R and the wafer W is adjusted. As a result, the pattern formed on each of the shot regions on the wafer W can be aligned with the pattern image of the reticle R, which is to be transfer exposed, while maintaining the high aligning precision.

FIG. 15A and FIG. 15B are each a schematically drawn constitution of the illumination optical system 302 of the projection aligner shown in FIG. 14, which show the detailed structure of the system.

FIG. 15A shows the front view of the illumination optical system 302 viewed from the Y direction indicated in FIG. 14, and FIG. 15B shows the front view of the illumination optical system 302 viewed from the X direction indicated in FIG. 14. In both figures, the alignment system 302 for use in branching a part of the exposure light incident to the illumination system 302 is omitted.

The exposure light source 303 (not shown) outputs a light flux consisting of approximately parallel beams having a wavelength of 248 nm (KrF excimer laser), 193 nm (ArF excimer laser), or 157 nm ($F_2$ laser), and the parallel light flux yields a square cross section. The parallel light flux emitted from the exposure light source 303 enters a beam reforming optical system 20 provided as a flux reforming portion which reforms the light flux into a flux having the desired cross section. The beam reforming optical system 20 is constructed from two cylindrical lenses (20A and 20B) having a refractive power in the Y direction; the cylindrical lens 20A provided on the light source side has a negative refractive power as to form divergent rays in the X direction, whereas the cylindrical lens 20B provided on the light irradiated plane side has a positive refractive power as to converge the divergent light flux output from the cylindrical lens 20A provided on the light source side into a parallel light flux. Thus, the parallel light flux output from the exposure light source 303 via a beam reforming optical system 20 is reformed into a rectangular light flux having a cross section with a certain size, because the flux width in the Y direction is enlarged. Furthermore, as other usable beam reforming optical systems 20, there can be mentioned a combination of cylindrical lenses each having a positive refractive power, an anamorphic prism, etc.

The light flux reformed by the beam reforming optical system 20 provides an incident light to a first relay optical system 21. The first relay optical system 21 comprises a front group (21A and 21B) consisting of two positive lenses and having a positive refractive power, and a back group (21C and 21D) also consisting of two positive lenses and having a positive refractive power. The front group (21A and 21B) of the first relay optical system 21 forms a condensed point (light source image) I at the focus on the reticle R side (back side) of the front group, and the back group (21C and 21D) of the first relay optical system 21 are set in such a manner that its focus on the light source side (front side) may coincide with the focus of the front group (21A, 21B). The first relay optical system 21 functions as such that the ejection plane of the exposure light source 303 may be conjugate with the incident plane of an optical integrator 30, which is a first means for forming a multi-source image described hereinafter. The mismatch in the light flux which illuminates the optical integrator 30, ascribed to the angular deviation of the light emitted from the exposure light source 303, can be corrected by functioning the first relay optical system 21, and thus allows a larger angular deviation of the light emitted from the exposure light source 303. The light guide optical system which guides the light emitted from the exposure light source 303 to the first means for forming a multi-source image is constructed from a beam reforming optical system 20 and the first relay optical system 21.

The light flux passed through the first relay optical system 21 provides an incident light for the optical integrator 30 which functions as a first means for forming a multi-source image, and forms a plurality of light source images arranged linearly in three rows. The optical integrator 30 is constructed from an arrangement of a plurality of biconvex lens elements each having a nearly square-shaped cross section, and the optical integrator 30 as a whole exhibits a rectangular cross section. Each of the biconvex lens elements has a same curvature (refractive power) in the X and the Y directions.

Accordingly, the parallel light fluxes passed through each of the lens elements constituting the optical integrator 30 are each converged to form a light source image on the ejecting side of each of the lens elements. Thus, a plurality of light source images corresponding to the number of the lens elements are formed at position A1 on the ejecting side of the optical integrator 30; substantially, a secondary light source is formed at this position.

The light fluxes emitted from a plurality of secondary light sources thus formed by the optical integrator 30 are then converged by a second relay optical system 40 to further provide the incident light for an optical integrator 50 which functions as a second means for forming a multi-source image to form a plurality of light source images.

The optical integrator 50 is constructed from an arrangement of a plurality of biconvex lens elements each having a rectangular lens cross section, and each of the lens elements has a cross section shaped in such a manner that it may be analogous to the shape of the cross section shape of the optical integrator 30. The optical integrator 50 as a whole exhibits a square cross section. Each of the biconvex lens elements has a same curvature (refractive power) in the planar direction parallel to the paper sheet of FIG. 15A and in the planar direction parallel to the paper sheet of FIG. 15B.

Thus, the parallel light fluxes from the optical integrator 30 and passed through each of the lens elements constituting the optical integrator 50 are each converged to form a light source image on the ejecting side of each of the lens elements. Thus, a plurality of light source images arranged in a square shape are formed at position A2 on the ejecting side of the optical integrator 50; substantially, a tertiary light source is formed at this position.

The second relay optical system 40 not only functions to make the position of the incident plane B1 of the optical integrator 30 conjugate with the position of the incident plane B2 of the optical integrator 50, but also provides the position of the ejecting plane A1 of the optical integrator 30 conjugate with the position of the ejecting plane A2 of the optical integrator 50. In the explanation above, the optical integrator 30 as well as the optical integrator 50 were shown in the shape of fly-eye lenses, but there is no particular limitation on the shape of the optical integrator for use in the illumination system of the projection aligner according to the present invention, and also usable are, for instance, micro fly-eye consisting of a plurality of very minute lens elements, a rod-like optical element of an inner plane reflection type (a kaleidoscope rod), a diffractive optical element (DOE), etc.

An aperture stop AS having an aperture portion with a predetermined shape is provided at the position A2 at which the tertiary light source is formed, or at a position in the vicinity thereof. Thus, the light fluxes emitted from the tertiary light source shaped into a circular cross section by the aperture stop AS are converged by a condenser optical system 60 provided as the converging optical system, to uniformly illuminate the reticle R, which is the object to be irradiated, in a slit-like manner.

The projection optical system 304 shown in FIG. 14 consists of silica glass members each assembled in such a manner that they may satisfy the arrangement conditions as such that the projection optical system as a whole yield a signed characteristic birefringence value in the range of from −0.5 to +0.5 nm/cm. Furthermore, the silica glass members are assembled with each other in such a manner that they may satisfy the arrangement condition as such that the Strehl value of the signed birefringence value based on the effective optical path of the entire projection optical system is 0.93 or higher. Moreover, the silica glass members used in the projection optical system are such that they each yield a signed birefringence value in a range of from −0.2 to +0.2 nm/cm in the vicinity of the center of the effective cross section thereof, that the distribution of the mean signed birefringence values in the radius direction has no extremes at portions other than the center, that the mean signed birefringence values $B_{ij}$ for a plurality of points within the plane vertical to the optical axis having a center corresponding to the crossing point with the optical axis fall in a range of from −2.0 to +2.0 nm/cm, and that the maximum gradient $F_i$ for the distribution curve in the direction of the radius of the mean signed birefringence values $B_{ij}$ is 0.2 nm/cm or lower per 10 mm of the width in the direction of the radius.

Thus, by using the projection optical system constructed from the silica glass members according to the present invention, the irradiation optical system, and the reticle as described above, it is made possible to suppress the influence of birefringence in the silica glass members, and hence, a projection aligner having a high resolution can be implemented.

The silica glass member, the method for producing the same, and the projection aligner using an optical system constructed by the silica glass member according to the present invention are described in further detail below by way of examples and comparative examples. It should be understood, however, that the present invention is not limited thereby.

EXAMPLE 1

A silica glass member was produced by direct method (flame hydrolysis) in accordance with the production method with reference to FIG. 6 using a synthetic furnace shown in FIG. 7. First, in the step for synthesizing a silica glass, fine glass particles were obtained by ejecting silicon tetrachloride from the central portion of a multi-tubular burner while maintaining the temperature inside the synthetic furnace in a range of from 1300 to 1500° C., and hydrolyzing it in an oxyhydrogen flame. In this case, a multi-tubular burner having a structure similar to that shown in FIG. 8 was used. The conditions for ejecting the gaseous raw material, gaseous oxygen, and gaseous hydrogen were set as follows. In the explanation, any element corresponding to the elements already referred in the multi-tubular burner shown in FIG. 8 is referred to by using the same expression. More specifically, the flow rate of the gaseous raw material was set at 30 g/min, the flow rate of the first gaseous hydrogen was set at 75 slm, the flow speed of the first gaseous hydrogen was set at 53 m/sec, the flow rate of the second gaseous hydrogen was set at 150 slm, the flow speed of the second gaseous hydrogen was set at 6 m/sec, the flow rate of the third gaseous hydrogen was set at 500 slm, the flow speed of the third gaseous hydrogen was set at 3 m/sec, the flow rate of the first gaseous oxygen was set at 37.5 slm, the flow speed of the first gaseous oxygen was set at 37 m/sec, the flow rate of the second gaseous oxygen was set at 75 slm, the flow speed of the second gaseous oxygen was set at 21 m/sec, the flow rate of the third gaseous oxygen was set at 250 slm, and the flow speed of the third gaseous oxygen was set at 9 m/sec.

Thus, a transparent silica glass bulk 470, which was 400 mm in diameter and 800 in thickness, was obtained by depositing the fine glass particles on a rotating and vibrating target, while simultaneously applying vitrification. The rotation speed of the target was set at 7.50 rpm. The amplitude of vibration (stroke) in the X-axis direction was set to 40 mm in the X direction and 120 mm in the Y direction. In this manner, a silica glass bulk containing hydroxyl groups was obtained, such that when measured in a plurality of measuring points at a predetermined inner plane yield a maximum and a minimum hydroxyl group concentration of 1030 ppm and 980 ppm; thus, the difference in the maximum and the minimum hydroxyl group concentration as measured in a plurality of measuring points at a predetermined inner plane was found to be 50 ppm. Furthermore, preliminary synthetic tests were performed 10 times under the synthetic conditions above, but by changing the furnace and the burner. As a result, the reproducibility of the hydroxyl group concentration and the distribution state thereof was found to be ±10 ppm, and thus was confirmed that the synthesis can be performed with sufficiently high reliability.

Then, after completing the step of synthesizing the silica glass bulk, the evacuation flow rate was decreased to 1/10, and while preventing heat loss from occurring from the evacuation outlet and the opening of the furnace, the step of cooling the silica glass bulk to a temperature of 1000° C. was carried out under a pressure region of from 0.01 to 0.15 MPa (abs), and by controlling the cooling rate in the temperature range of from 1500 to 1800° C. to 10° C./min. In particular, the opening portion of the synthetic furnace was controlled by using a shutter mechanism to maintain the heat inside the synthetic furnace.

Subsequently in the step of cutting the silica glass bulk, the silica glass bulk cooled to room temperature was cut to obtain a cylindrical test piece 250 mm in diameter and 70 mm in thickness. In this case, the central position of the silica glass bulk was set at the center of rotation symmetry in accordance with the outer diameter of the silica glass bulk, and was aligned with the center of the test piece cut out therefrom.

Then, in the step of heat treating the silica glass member, the temperature of the test piece was elevated to 1000° C. and held at the temperature for a duration of 10 hours. The test piece was cooled thereafter to a temperature of 500° C. while controlling the cooling rate to 10° C./h, and was held at the temperature for a duration of 10 hours. Then, the test piece was cooled again to room temperature while controlling the cooling rate to 1° C./h. Thus was obtained a heat treated test piece. In this instance, the center of heat treatment in the test piece subjected to the heat treatment and annealing was matched with the center of the test piece.

The distribution of the mean signed birefringence values $B_{ij}$ in the radius direction was measured on the heat treated disk-shaped test piece. Phase modulation method was employed for the measurement of birefringence. The measuring points were set at the crossing points of the two straight lines extended from the center of the effective cross section to the radius direction with the plurality of virtual concentrical circles in accordance with FIG. 13A.

As a result, it was confirmed that the deviation of the mean signed birefringence values $B_{ij}$ in the radius direction for the heat treated disk-shaped test piece falls in a range of from −0.9 nm/cm to −0.1 nm/cm. Furthermore, it was confirmed that the signed birefringence values $A_{i0}$ in the vicinity of the center of the test piece were in a range of from −0.2 to +0.2 nm/cm. It was also confirmed that the test piece does not yield any extremes for the mean signed birefringence values $B_{ij}$ except at the center. In addition, the maximum gradient $F_i$ for the distribution curve of the mean signed birefringence values $B_{ij}$ in the radius direction was confirmed to be not larger than 0.2 nm/cm per 10 mm.

EXAMPLE 2

A silica glass member was produced by direct method (flame hydrolysis) in accordance with the production method with reference to FIG. 6 using a synthetic furnace shown in FIG. 7. Basically, a test piece was produced in the same manner as in Example 1, except for changing the treatment conditions in each of the process steps described in the production method with reference to FIG. 6.

In the step for synthesizing a silica glass bulk, a gas containing gaseous oxygen and gaseous hydrogen at a ratio of 1:3 was ejected from the multi-tubular burner, so as to conduct the combustion in a hydrogen-rich atmosphere as compared with the theoretical air-fuel ratio of 1:2. More specifically, the flow rate of the gaseous raw material was set at 30 g/min, the flow rate of the first gaseous hydrogen was set at 75 slm, the flow speed of the first gaseous hydrogen was set at 52 m/sec, the flow rate of the second gaseous hydrogen was set at 150 slm, the flow speed of the second gaseous hydrogen was set at 6 m/sec, the flow rate of the third gaseous hydrogen was set at 500 slm, the flow speed of the third gaseous hydrogen was set at 3 m/sec, the flow rate of the first gaseous oxygen was set at 25 slm, the flow speed of the first gaseous oxygen was set at 25 m/sec, the flow rate of the second gaseous oxygen was set at 50 slm, the flow speed of the second gaseous oxygen was set at 14 m/sec, the flow rate of the third gaseous oxygen was set at 165 slm, and the flow speed of the third gaseous oxygen was set at 6 m/sec.

Furthermore, the portion of the silica glass bulk that is touched by the oxyhydrogen flame was displaced from the center of the target by 15 mm. Moreover, the rotation speed of the target was set at 7.50 rpm. The target was not subject to XY vibrational motion.

In this manner, a silica glass bulk containing hydroxyl groups was obtained, such that when measured in a plurality of measuring points at a predetermined inner plane yields a maximum and a minimum hydroxyl group concentration of 1050 ppm and 1005 ppm; thus, the difference in the maximum and the minimum hydroxyl group concentration as measured in a plurality of measuring points at a predetermined inner plane was found to be 45 ppm.

Then, the silica glass bulk was maintained in the furnace for cooling without applying any particular temperature control, and was cut to obtain a cylindrical test piece 400 mm in diameter and 100 mm in thickness.

Because the thus obtained test piece contained striae, it was once cooled down to room temperature, and in the step of heat treating the silica glass member, the test piece was placed inside a heat treatment furnace equipped with a carbon heating element as the heat source. Thus, an annealing treatment was applied to the test piece under conditions as follows.

More specifically, as shown in FIG. 9, the temperature inside the heat treatment furnace was elevated from room temperature to 2000° C. at a controlled heating rate of 2° C./min under a gaseous nitrogen atmosphere and at a pressure of 0.1 MPa, and was held at the temperature for about 0.5 hours. Then, the test piece was cooled down from 2000° C. to 1000° C. while controlling the cooling rate to 10° C./min. The cooling was stopped after 100 minutes of time had elapsed, and the test piece was held at 1000° C. for 1 hour to homogenize the internal temperature thereof. For the annealing treatment thereafter, the test piece was cooled from 1000° C. to 600° C. while controlling the cooling rate to 10° C./h. Subsequently, the test piece was cooled down from 600° C. to room temperature while controlling the cooling rate to 10° C./h.

On measuring the distribution of the mean signed birefringence values $B_{ij}$ in the radius direction of the heat treated disk-shaped test piece, it was found that the deviation of the mean signed birefringence values $B_{ij}$ in the radius direction for the heat treated disk-shaped test piece falls in a range of from +0.1 nm/cm to +1.0 nm/cm.

Furthermore, it was confirmed that the signed birefringence values $A_{i0}$ in the vicinity of the center of the test piece were in a range of from −0.2 to +0.2 nm/cm. It was also confirmed that the test piece does not yield any extremes for the mean signed birefringence values $B_{ij}$ except at the center. In addition, the maximum gradient $F_i$ for the distribution curve of the mean signed birefringence values $B_{ij}$ in the radius direction was confirmed to be not larger than 0.2 nm/cm per 10 mm.

EXAMPLE 3

A silica glass member was produced by soot method in accordance with the production method with reference to FIG. 6. Basically, a test piece was produced in the same manner as in Example 1, except for changing the treatment conditions in each of the process steps described in the production method with reference to FIG. 6.

First, in the step for synthesizing silica glass bulk, a porous glass (soot body) 180 mm in diameter and 500 mm in length was obtained by hydrolyzing a silicon compound in an oxyhydrogen flame. The conditions for ejecting the gas from the multi-tubular burner were set to be the same as those generally employed in the soot method. The rotation speed of the target was set at 20 rpm.

The soot body thus obtained was subjected to dehydration treatment at 1100° C. for a duration of 20 hours under a mixed gas atmosphere containing gaseous chlorine and gaseous helium at a ratio of 1:20. Then, the body was subjected to a heat treatment at 1650° C. for a duration of 15 hours to obtain a transparent product. After the treatment, the soot body was cooled to 500° C. while controlling the cooling rate to 5° C./min. Subsequently, the soot body was cooled down to room temperature while controlling the cooling rate to 5° C./min.

Thus, the concentration values of hydroxyl groups as measured at a plurality of measuring points at a predetermined inner plane were all found to be 1 ppm or less. That is, a silica glass bulk having a difference in the maximum and the minimum hydroxyl group concentration as measured in a plurality of measuring points at a predetermined inner plane of 1 ppm or less was obtained.

Then, the silica glass bulk was cut to obtain a cylindrical test piece 250 mm in diameter and 70 mm in thickness. The test piece was subjected to a step of heat treating a silica glass member under conditions similar to those employed in Example 1.

On measuring the distribution of the mean signed birefringence values $B_{ij}$ in the radius direction of the heat treated disk-shaped test piece, it was found that the deviation of the mean signed birefringence values $B_{ij}$ in the radius direction for the heat treated disk-shaped test piece falls in a range of from −0.1 nm/cm to +1.8 nm/cm.

Furthermore, it was confirmed that the signed birefringence values $A_{i0}$ in the vicinity of the center of the test piece were in a range of from −0.2 to +0.2 nm/cm. It was also confirmed that the test piece does not yield any extremes for the mean signed birefringence values $B_{ij}$ except at the center. In addition, the maximum gradient $F_i$ for the distribution curve of the mean signed birefringence values $B_{ij}$ in the radius direction was confirmed to be not larger than 0.2 nm/cm per 10 mm.

The silica glass thus obtained was found to contain fluorine at a concentration of 0.5 wt. % or higher, and the distribution of fluorine was found to yield a difference in the maximum and the minimum concentration values of 1.0 wt. % or less.

Comparative Example 1

A silica glass member was produced by direct method in accordance with the production method with reference to FIG. 6 using a synthetic furnace shown in FIG. 7. Basically, a test piece was produced in the same manner as in Example 1, except for changing the treatment conditions as follows for each of the process steps described in the production method with reference to FIG. 6. The rotation speed of the target during the synthesis was set at 5.0 rpm. Furthermore, the XY vibrational motion was stopped during the synthesis, and the target was set still at the origin, i.e., at a position of ±0 for both X and Y directions.

Comparative Example 2

A silica glass member was produced by soot method in accordance with the production method with reference to FIG. 6 using a synthetic furnace shown in FIG. 7. Basically, a test piece was produced in the same manner as in Example 1, except for changing the treatment conditions as follows for each of the process steps described in the production method with reference to FIG. 6.

During the synthesis, the rotation speed of the target was set at 5.0 rpm. No temperature control was performed during the cooling step. Thus, the cooling rate in the temperature region of from 1500 to 1800° C. was found to be in a range of from 100 to 200° C./h.

<Evaluation Tests for Silica Glass Members>

A KrF excimer laser radiation (having a wavelength of 248 nm) was irradiated for 10 minutes to each of the test pieces obtained in Example 1, Example 2, Comparative Example 1, and Comparative Example 2. Thus, the initial transmittance and the transmittance after time elapse of 10 minutes were obtained for each of the test pieces. For the test piece obtained in Example 3 by soot method, a $F_2$ laser radiation (having a wavelength of 157 nm) was irradiated for 10 minutes to obtain the initial transmittance and the transmittance after an elapse of 10 minutes. Then, the quantity of drop in transmittance after irradiating a laser radiation for 10 minutes for each of the test pieces was calculated, and the durability against laser irradiation of each of the test pieces was evaluated by comparing the values with each other.

The test results were evaluated by rating them as follows. Rating standard 2: the drop in transmittance after irradiating a laser radiation for 10 minutes was less than 5%; and 1: the drop in transmittance after irradiating a laser radiation for 10 minutes was 5% or more. The results of evaluation are given in Table 1.

TABLE 1

| | Difference between maximum and minimum values in the concentration of hydroxyl groups (ppm) | Cooling rate in the cooling step for silica glass bulk (° C./min) | Signed birefringence value $B_{ij}$ (nm/cm$^{-1}$) | Laser radiation irradiated | Conditions of irradiation | Initial transmittance (%/cm) | Laser durability |
|---|---|---|---|---|---|---|---|
| Example 1 | 50 | 10 | −0.9—0.1 | KrF excimer | 400 mJ/cm$^3$, 1 KHz | 99.9 | 2 |
| Example 2 | 45 | 10 | +0.1—+1.0 | KrF excimer | 400 mJ/cm$^3$, 1 KHz | 99.9 | 2 |
| Example 3 | 1≧ | 5 | −0.1—1.8 | F$_2$ excimer | 50 mJ/cm$^3$, 1 KHz | 95.0 | 2 |
| Comp. Ex. 1 | 250 | 10 | −2.3—+2.1 | KrF excimer | 400 mJ/cm$^3$, 500 Hz | 99.9 | 1 |
| Comp. Ex. 2 | 50 | 100–200 | −2.5—+3.4 | KrF excimer | 400 mJ/cm$^3$, 1 KHz | 99.9 | 1 |

From the results shown in Table 1, it can be understood that the test pieces obtained in Examples 1 to 3 yield a small internal birefringence, and exhibit excellent initial transmittance as well as laser durability. Hence, it was confirmed that they are suitable for use as a light transmitting member in an optics for ultraviolet radiations 250 nm or shorter in wavelength.

<Evaluation Test for Projection Aligner Equipped with an Optical System Constructed from Silica Glass Members>

A projection optical system 1000 whose constitution is shown in FIG. 5 was each assembled by using the test pieces obtained in Examples 1 to 3 and Comparative Examples 1 and 2, and was each set in a projection aligner shown in FIG. 14. The resolution was measured for each of the thus obtained projection aligners.

A plurality of test pieces were prepared in each of the Examples 1 to 3 and Comparative Examples 1 and 2 in order to assemble them into the projection optical system. That is, a plurality of silica glass bulks were prepared under the same conditions described in the production methods above, and a plurality of test pieces were cut out and selected therefrom such that they yield the same distribution characteristics in the radius direction in mean signed birefringence values $B_{ij}$ as that of the test pieces described in Examples 1 to 3 and Comparative Examples 1 and 2.

[Projection Aligner 1 Equipped with a Projection Optical System whose Constitution is of Examples 1 to 3]

The test pieces obtained in Examples 1 to 3 were each processed into lenses and assembled into a projection optical system 1000 shown in FIG. 5. More specifically, 23 lenses other than the lenses L45, L46, L63, L65, L66, and L67 produced from single crystals of calcium fluoride were constructed from the test pieces obtained in Examples 1 to 3. Then, the signed characteristic birefringence value H and the Strehl values of the signed birefringence values S were calculated for the projection optical systems thus obtained, and the one which yielded the most favorable values was selected as Example 1. Furthermore, the resolution was measured on the projection aligner shown in FIG. 14 thus assembled by using the projection optical system above.

[[Projection Aligner 2 Equipped with a Projection Optical System whose Constitution is of Comparative Examples 1 and 2]

Projection optical systems were each assembled in the same manner as those obtained by using the constitution of Examples 1 to 3, except for using the test pieces obtained in Comparative Examples 1 and 2. Furthermore, the resolution was measured on the projection aligner shown in FIG. 14 thus assembled by using the projection optical system above.

The optical properties based on the signed birefringence of the two projection optical systems above, as well as the measured resolution for the projection aligner using them are shown in Table 2.

TABLE 2

| | Test pieces used | H (nm/cm) | S | Resolution (μm) |
|---|---|---|---|---|
| Projection aligner 1 | Examples 1, 2, 3 | −0.35 | 0.95 | 0.12 |
| Projection aligner 2 | Comparative Examples 1, 2 | +1.50 | 0.87 | 0.20 |

From the values obtained for the resolution of the two projection aligners shown in Table 2, it can be understood that the projection aligners using the projection optical system obtained by assembling the test pieces prepared in Examples 1 to 3 yield excellent resolution. Furthermore, it was confirmed that the projection optical system produced by assembling silica glass members according to the present invention which satisfy the conditions of arranging the silica glass members based on the signed birefringence values, i.e., that the projection optical system as a whole should yield a signed characteristic birefringence value H in the range of from −0.5 to +0.5 nm/cm, shows a favorable imaging performance. Furthermore, it was confirmed that the projection aligners using the projection optical system constructed from the silica glass member according to the present invention can achieve an extremely high resolution. In the case of a projection aligner using the test pieces of Examples 1 to 3, a resolution as high as 0.12 μm is achieved.

On the contrary, the projection optical systems assembled by using the test pieces of Comparative Examples 1 and 2 yielded a signed characteristic birefringence value H of +0.5 nm/cm or higher, and were unable to show a favorable imaging characteristics. Thus, projection aligners using those projection optical systems could not achieve favorable values of resolution.

INDUSTRIAL APPLICABILITY

As described above, in accordance with the present invention, the non-uniform distribution in the birefringence values within the silica glass member can be quantitatively evaluated by taking particular notice on the direction of the fast axis, and, while controlling the distribution in the concentration of hydroxyl groups contained in the silica glass member to a predetermined range, the distribution in the concentration of hydroxyl groups can be effectively homogenized within the silica glass member. Furthermore, it makes it possible to assemble an optics in such a manner that the distributions in birefringence within the silica glass members can be cancelled out with each other by quantitatively figuring out the signed characteristic birefringence value of the entire optical system based on the signed birefringence values of each of the silica glass members. Accordingly, it makes it possible to suppress the influence of non-uniform distribution of birefringence values within the silica glass members on the optical transmittance or on the resolution of a projection aligner equipped with such an optical system assembled by using such silica glass members. Thus, the present invention provides a silica glass member having high optical transmittance as well as high resistance against ultraviolet radiations, a method for producing the same, and a projection aligner capable of realizing high resolution.

What is claimed is:

1. A silica glass member, which is a silica glass member for use with a light having a specific wavelength of 250 nm or shorter,
    in which the difference in the maximum and the minimum values of hydroxyl group concentration as measured in a plurality of points within a plane vertical to an optical axis whose center is the crossing point of its optical axis with the optical axis of the silica glass member is 50 ppm or lower;
    in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm,
    wherein said plurality of signed birefringence values of said silica glass member are expressed based on the formulae as follows:

$$-2.0 \leq B_{ij} \leq 2.0 \text{ nm/cm} \quad (1)$$

$$Bij = \frac{\sum_{k=1}^{h} A_{ijk}}{h} \quad (2)$$

where, in formula (1) and (2) above,
    i represents the number of said silica glass members L (i=1, 2, . . . m; 2≦m),
    j represents the number of concentrical virtual circles C present on an effective cross section vertical to the optical axis of said silica glass member L, each having a center on said optical axis and different from each other in radius from said optical axis (j=1, 2, . . . n; 1≦n),
    k represents the number of measuring points located on the circumference of said concentrical circles C (k=1, 2, . . . h; 1≦h),
    $A_{ijk}$ represents the signed birefringence value at the kth measuring point $P_{ijk}$ located on the circumference of a concentrical circle $C_{ij}$ of a silica glass member Li, and $B_{ij}$ represents the mean signed birefringence value corresponding to the arithmetic mean of the signed birefringence values of the measuring points located on the circumference of a concentrical circle $C_{ij}$ of a silica glass member Li.

2. A silica glass member as claimed in claim 1, wherein the silica glass member is used with a light having a specific wavelength of 180 nm or shorter, and
    wherein the maximum value of the hydroxyl group concentration as measured in a plurality of points within a plane vertical to an optical axis whose center is the crossing point of its optical axis with the optical axis of the silica glass member is 50 ppm or lower.

3. A method for producing a silica glass member, comprising:
    a synthetic step of silica glass bulk comprising, in a synthetic furnace equipped with a burner having a plurality of tubes, ejecting a raw material and a combustion gas from the plurality of tubes of said burner to hydrolyze said raw material in an oxyhydrogen flame, and thereby synthesizing a silica glass bulk having a difference in the maximum and the minimum values of hydroxyl group concentration as measured in a plurality of points within a predetermined internal plane of the bulk of 50 ppm or lower;
    a step of cooling silica glass bulk, comprising cooling said silica glass bulk under a pressure range of from 0.01 to 0.15 MPa (abs) while controlling the cooling rate in the temperature region of from 1500 to 1800° C. to a range of from 5 to 10° C./min;
    a step of cutting silica glass bulk, comprising cutting out said silica glass bulk to obtain a silica glass member having the desired shape and size; and
    a step of heat treating silica glass member, comprising applying a heat treatment to said silica glass member to obtain a silica glass member in which a difference in the maximum and the minimum values of hydroxyl group concentration as measured in a plurality of points within a plane vertical to an optical axis whose center is the crossing point of its optical axis with the optical axis of the silica glass member is 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

4. A method for producing a silica glass member as claimed in claim 3, wherein the production method further comprises a step of measuring the signed birefringence value in the later stage of the step of heat treating said silica glass member, said step comprising measuring the signed birefringence values inside said silica glass member.

5. A method for producing a silica glass member as claimed in claim 3, wherein the silica glass member obtained in the step of heat treating said silica glass member yields a maximum value of the hydroxyl group concentration as measured in a plurality of points within a plane vertical to an optical axis whose center is the crossing point of its optical axis with the optical axis of the silica glass member of 50 ppm or lower.

6. A method for producing a silica glass member as claimed in claim 3, wherein said plurality of signed birefringence values of said silica glass member are expressed based on the formulae as follows:

$$-2.0 \leq B_{ij} \leq 2.0 \text{ nm/cm} \quad (1)$$

$$Bij = \frac{\sum_{k=1}^{h} A_{ijk}}{h}.$$

7. A method for producing a silica glass member as claimed in claim 3, wherein the heat treatment performed in said step of heat treating the silica glass member comprises elevating the temperature of said silica glass member to a predetermined temperature not higher than 1200° C., and after holding the temperature for a predetermined duration of time, cooling said silica glass member in a predetermined temperature region not higher than 1200° C. while controlling the cooling rate to a predetermined rate.

8. A method for producing a silica glass member, comprising:

a synthetic step of silica glass bulk comprising, in a synthetic furnace equipped with a burner having a plurality of tubes, ejecting a raw material and a combustion gas from the plurality of tubes of said burner to hydrolyze said raw material in an oxyhydrogen flame, and thereby synthesizing a silica glass bulk having a difference in the maximum and the minimum values of hydroxyl group concentration as measured in a plurality of points within a predetermined internal plane of the bulk of 50 ppm or lower;

a step of cooling silica glass bulk, comprising, while holding said silica glass bulk inside said synthetic furnace, cooling said silica glass bulk based on the temperature difference between the silica glass bulk and the temperature of the external environment;

a step of cutting silica glass bulk, comprising cutting out said silica glass bulk to obtain a silica glass member having the desired shape and size;

a first heat treatment step of silica glass member, comprising elevating the temperature of said silica glass member to a predetermined temperature in the temperature range of from 1600 to 2300° C. in an inert gas atmosphere in a pressure range of from 0.01 to 0.15 MPa (abs); and a second heat treatment step of silica glass member, comprising, in an inert gas atmosphere maintained in a pressure range of from 0.01 to 0.15 MPa (abs), cooling said silica glass bulk while controlling the cooling rate in the temperature region of from 1500 to 1800° C. to a range of from 5 to 10° C./min to obtain a silica glass member in which a difference in the maximum and the minimum values of hydroxyl group concentration as measured in a plurality of points within a plane vertical to an optical axis whose center is the crossing point of its optical axis with the optical axis of the silica glass member is 50 ppm or lower, and in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm.

9. A method for producing a silica glass member as claimed in claim 8, wherein the method further comprises, between the first heat treatment step and the second heat treatment step, a third heat treatment step of silica glass member comprising holding the silica glass member for a predetermined duration of time at a holding temperature in a range of from 1600 to 2300° C.

10. A method for producing a silica glass member as claimed in claim 8, wherein said first heat treatment step of silica glass member is performed at a heating rate of from 1 to 10° C./min.

11. A method for producing a silica glass member as claimed in claim 8, wherein the production method further comprises a step of measuring the signed birefringence value in the later stage of the second heat treatment step of said silica glass member, said step comprising measuring the signed birefringence values inside said silica glass member.

12. A method for producing a silica glass member as claimed in claim 8, wherein the silica glass member obtained in the step of heat treating said silica glass member yields a maximum value of the hydroxyl group concentration as measured in a plurality of points within a plane vertical to an optical axis whose center is the crossing point of its optical axis with the optical axis of the silica glass member of 50 ppm or lower.

13. A method for producing a silica glass member as claimed in claim 8, wherein said plurality of signed birefringence values of said silica glass member are expressed based on the formulae as follows:

$$-2.0 \leq B_{ij} \leq 2.0 \text{ nm/cm} \quad (1)$$

$$B_{ij} = \frac{\sum_{k=1}^{h} A_{ijk}}{h}.$$

14. A projection aligner comprising an exposure light source emitting a light having a wavelength of 250 nm or shorter as the exposure light, a reticle having formed thereon an original pattern image, an irradiation optical system which irradiates a radiation output from said exposure light source to said reticle, a projection optical system which projects a pattern image output from said reticle onto a photosensitive substrate, and an alignment system which aligns said reticle and said photosensitive substrate, in which at least a part of the silica glass member constituting said irradiation optical system, the silica glass member constituting said projection optical system, and said reticle, is made of a silica glass member for use with a light having a specific wavelength of 250 nm or shorter, in which the difference in the maximum and the minimum values of hydroxyl group concentration as measured in a plurality of points within a plane vertical to an optical axis whose center is the crossing point of its optical axis with the optical axiss of the silica glass member is 50 ppm or lower;

in which the plurality of signed birefringence values obtained based on the birefringence values measured on several points within a plane vertical to an optical axis whose center is the crossing point of its optical axis with the optical axis of the silica glass member and the direction of the fast axis fall within a range of from −2.0 to +2.0 nm/cm, wherein said plurality of signed birefringence values of said silica glass member are expressed based on the formulae as follows:

$$-2.0 \leq B_{ij} \leq 2.0 \text{ nm/cm} \quad (1)$$

$$B_{ij} = \frac{\sum_{k=1}^{h} A_{ijk}}{h} \quad (2)$$

where, in formula (1) and (2) above, i represents the number of said silica glass members L (i=1, 2, . . . m; 2≦m), j represents the number of concentrical virtual circles C present on an effective cross section vertical to the optical axis of said silica glass member L, each having a center on said optical axis and different from each other in radius from said optical axis (i=1, 2, ... n; 1≦n), k represents the number of measuring points located on the circumference of said concentrical circles C (k=1, 2, ... h; 1≦h), $A_{ijk}$ represents the signed birefringence value at the kth measuring point $P_{ijk}$ located on the circumference of a concentrical circle $C_{ij}$ of a silica glass member Li, and $B_{ij}$ represents the mean signed birefringence value corresponding to the arithmetic mean of the signed birefringence values of the measuring points located on the circumference of a concentrical circle $C_{ij}$ of a silica glass member Li.

* * * * *